United States Patent
Yonemitsu et al.

[19]

[11] Patent Number: 6,143,083
[45] Date of Patent: Nov. 7, 2000

[54] SUBSTRATE TRANSFERRING MECHANISM

[75] Inventors: Shuji Yonemitsu; Toshikazu Karino; Hisashi Yoshida; Shinichiro Watahiki; Yuji Yoshida; Hideo Shimura; Takeshi Sugimoto; Yukinori Aburatani; Kazuhito Ikeda, all of Tokyo, Japan

[73] Assignee: Kokusai Electric Co., Ltd., Tokyo, Japan

[21] Appl. No.: 09/453,031

[22] Filed: Dec. 2, 1999

Related U.S. Application Data

[62] Division of application No. 08/692,461, Aug. 5, 1996, Pat. No. 6,066,210.

[30] Foreign Application Priority Data

Aug. 5, 1995 [JP] Japan ..................................... 7-219768
Aug. 5, 1995 [JP] Japan ..................................... 7-219769

[51] Int. Cl.[7] ........................... C23C 16/00; B65G 49/07
[52] U.S. Cl. ........................ 118/719; 118/724; 414/217; 414/416; 414/935; 414/936; 414/937; 414/939; 414/940; 204/298.25; 204/298.35; 156/345
[58] Field of Search ................................... 118/719, 724; 414/217, 416, 935, 936, 937, 939, 940; 204/298.25, 298.35; 156/345

[56] References Cited

U.S. PATENT DOCUMENTS 4,263,872 4/1981 Ban ......................................... 118/721
4,681,773 7/1987 Bean ......................................... 427/38

(List continued on next page.)

FOREIGN PATENT DOCUMENTS

| 6010625 | 1/1985 | Japan . |
|---|---|---|
| 63139811 | 6/1988 | Japan . |
| 2152251 | 6/1990 | Japan . |
| 330320 | 2/1991 | Japan . |
| 430552 | 2/1991 | Japan . |
| 426138 | 1/1992 | Japan . |
| 570950 | 3/1993 | Japan . |
| 5152215 | 6/1993 | Japan . |
| 5238513 | 9/1993 | Japan . |
| 6219513 | 8/1994 | Japan . |
| 786169 | 3/1995 | Japan . |

*Primary Examiner*—Jeffrie R Lund

[57] ABSTRACT

A substrate processing apparatus comprises a substrate transfer chamber; a substrate processing chamber disposed on a first side wall of the substrate transfer chamber; an intermediate substrate holding chamber disposed on a second side wall of the substrate transfer chamber; a first substrate holder disposed within the intermediate substrate holding chamber; a second substrate holder disposed within the substrate processing chamber; a first substrate transfer robot, disposed within the substrate transfer chamber, for transferring the substrate between the substrate processing chamber and the intermediate substrate holding chamber; a first gate valve disposed between the substrate processing chamber and the substrate transfer chamber; a second gate valve disposed between the substrate transfer chamber and the intermediate substrate holding chamber; an atmospheric pressure section located opposite to the substrate transfer chamber with respect to the intermediate substrate holding chamber; a third valve disposed between the intermediate substrate holding chamber and the atmospheric pressure section; a cassette holder disposed within the atmospheric pressure section; and a second substrate transfer robot disposed within the atmospheric pressure section, for transferring the substrate between a cassette held in the cassette holder and the intermediate substrate holding chamber.

3 Claims, 15 Drawing Sheets

U.S. PATENT DOCUMENTS

| | | | |
|---|---|---|---|
| 4,775,281 | 10/1988 | Prentakis | 414/416 |
| 5,067,218 | 11/1991 | Williams | 29/25.01 |
| 5,076,205 | 12/1991 | Vowles et al. | 118/719 |
| 5,186,718 | 2/1993 | Tepman et al. | 29/25.01 |
| 5,303,671 | 4/1994 | Kondo et al. | 118/719 |
| 5,314,509 | 5/1994 | Kato et al. | 34/406 |
| 5,404,894 | 4/1995 | Shiraiwa | 134/66 |
| 5,439,547 | 8/1995 | Kumagai | 156/345 |
| 5,445,491 | 8/1995 | Nakagawa et al. | 414/786 |
| 5,460,478 | 10/1995 | Akimoto et al. | 414/786 |
| 5,462,397 | 10/1995 | Iwabuchi | 414/222 |
| 5,474,410 | 12/1995 | Ozawa et al. | 414/217 |
| 5,512,320 | 4/1996 | Turner et al. | 427/255 |
| 5,515,986 | 5/1996 | Turlot et al. | 216/71 |
| 5,534,074 | 7/1996 | Koons | 118/728 |
| 5,562,383 | 10/1996 | Iwai et al. | 414/217 |
| 5,562,387 | 10/1996 | Ishii et al. | 414/416 |
| 5,564,889 | 10/1996 | Araki | 414/786 |
| 5,571,330 | 11/1996 | Kyogoku | 118/719 |
| 5,609,689 | 3/1997 | Kato et al. | 118/719 |
| 5,611,655 | 3/1997 | Fukasawa et al. | 414/217 |
| 5,613,821 | 3/1997 | Muka et al. | 414/217 |
| 5,616,208 | 4/1997 | Lee | 156/345 |
| 5,695,564 | 12/1997 | Imahashi | 118/719 |
| 5,788,447 | 8/1998 | Yinemitsu et al. | 414/217 |
| 5,879,459 | 3/1999 | Gadgil et al. | 118/715 |

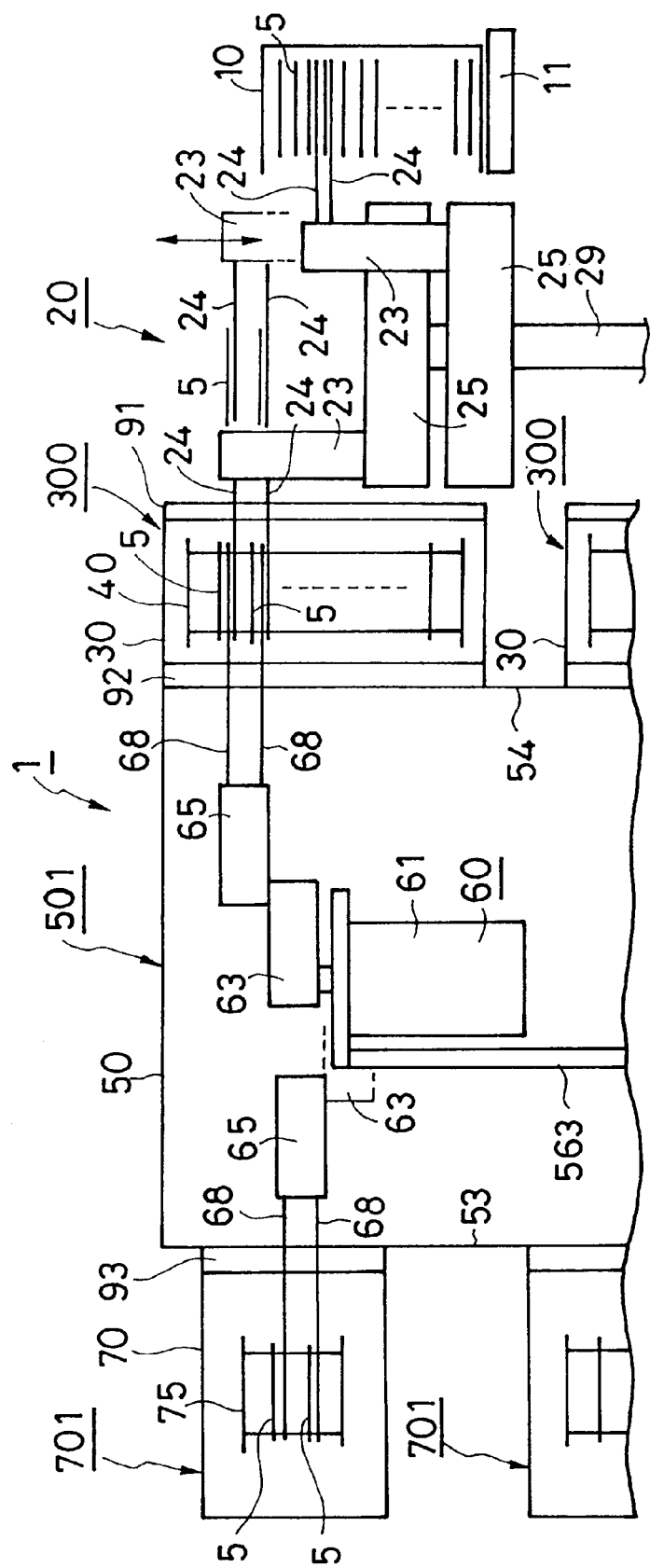

SUBSTRATE TRANSFERRING MECHANISM

This application is a divisional of application Ser. No. 08/692,461, filed on Aug. 5, 1996, now U.S. Pat. No. 6,006,210, the contents of which are hereby incorporated by reference.

BACKGROUND OF THE INVENTION

1. Field of the Invention

The present invention relates to a substrate processing apparatus, and particularly to a semiconductor wafer processing apparatus.

2. Description of the Related Art

FIG. 1 is a perspective view for explaining a conventional semiconductor wafer processing apparatus, and FIG. 2 is a cross-sectional view for explaining the conventional semiconductor wafer processing apparatus.

This conventional semiconductor wafer processing apparatus is composed of a wafer transfer chamber 150, which has a hexagonal shape as viewed from above, cassette chambers 131 and 132, wafer cooling chambers 141 and 142, and reaction chambers 171 and 172. The cassette chambers 131 and 132, the wafer cooling chambers 141 and 142, and the reaction chambers 171 and 172 are disposed on the side walls of the wafer transfer chamber 150. The wafer transfer chamber 150 is provided with a wafer transfer robot 160, an arm 166 of which is located within the wafer transfer chamber 150. The cassette chamber 131 (132) has a cassette elevator 129, which hoists and lowers a cassette 110 disposed within the cassette chamber 131 (132). The cassette 110 is loaded with a plurality of wafers 105 arranged vertically in layers. A gate valve 193 is disposed between the reaction chamber 171 (172) and the wafer transfer chamber 150; a gate valve 192 is disposed between the wafer transfer chamber 150 and the cassette chamber 131 (132); and the cassette chamber 131 (132) is also provided with a front door valve 191 for carrying in/out a cassette.

This conventional semiconductor wafer processing apparatus performs the following series of operations: the cassette 110 loaded with a plurality of wafers 105 is carried into the cassette chamber 131 (132) through the front door valve 191; the cassette 110 is then lifted or lowered to a predetermined height by the cassette elevator 129 within the cassette chamber 131 (132); a wafer 105 is then transferred by the arm 166 of the wafer transfer robot 160, from the cassette 110 located within the cassette chamber 131 (132) to the reaction chamber 171 (172); the wafer 105 then undergoes a predetermined processing, such as film deposition, in a heated state within the reaction chamber 171 (172); the processed wafer 105 is then transferred by the arm 166 of the wafer transfer robot 160 to the wafer cooling chamber 141 (142), where the wafer 105 is cooled to a predetermined temperature; and the cooled wafer 105 is then transferred into the cassette 110 by the arm 166 of the wafer transfer robot 160.

As described above, in the conventional semiconductor wafer processing apparatus, since the cassette 110 cannot hold a high-temperature wafer 105, a processed wafer 105 is first transferred from the reaction chamber 171 (172) to the wafer cooling chamber 141 (142) so as to be cooled to a predetermined temperature, and then the cooled wafer 105 is transferred to the cassette 110. Accordingly, the wafer cooling chamber 141 (142) must be provided in addition to the cassette chamber 131 (132).

However, the presence of the wafer cooling chamber 141 (142) increases the area occupied by the semiconductor wafer processing apparatus within a clean room accordingly. Further, the number of sides of the wafer transfer chamber 150 increases accordingly, resulting in an increase in the area occupied by the wafer transfer chamber 150. This also increases the area occupied by the semiconductor wafer processing apparatus within the clean room, resulting in an increased running cost.

SUMMARY OF THE INVENTION

In view of the foregoing, the primary object of the present invention is to provide a substrate processing apparatus which occupies a relatively small area.

According to the present invention, there is provided a substrate processing apparatus comprising:

a substrate transfer chamber which can be depressurized;

a substrate processing chamber, disposed on a first side wall of the substrate transfer chamber, for processing a substrate;

an intermediate substrate holding chamber which is disposed on a second side wall of the substrate transfer chamber and which can be depressurized independently of the substrate transfer chamber;

first substrate holding means, disposed within the intermediate substrate holding chamber, for holding the substrate;

second substrate holding means, disposed within the substrate processing chamber, for holding the substrate;

first substrate transfer means disposed within the substrate transfer chamber, the first substrate transfer means being capable of transferring the substrate between the substrate processing chamber and the intermediate substrate holding chamber;

a first valve, disposed between the substrate processing chamber and the substrate transfer chamber, the first valve being capable of providing hermetic vacuum isolation between the substrate processing chamber and the substrate transfer chamber when closed and allowing the substrate to pass therethrough when opened;

a second valve disposed between the substrate transfer chamber and the intermediate substrate holding chamber, the second valve being capable of providing hermetic vacuum isolation between the substrate transfer chamber and the intermediate substrate holding chamber when closed and allowing the substrate to pass therethrough when opened;

an atmospheric pressure section located at a side which is different from the substrate transfer chamber's side with respect to the intermediate substrate holding chamber;

a third valve disposed between the intermediate substrate holding chamber and the atmospheric pressure section, said third valve being capable of maintaining the intermediate substrate holding chamber under vacuum in isolation from the atmospheric pressure section when closed and allowing the substrate to pass therethrough when opened;

cassette holding means disposed within the atmospheric pressure section; and second substrate transfer means disposed within the atmospheric pressure section, said second substrate transfer means being capable of transferring the substrate between a cassette held in the cassette holding means and the intermediate substrate holding chamber.

In the present invention, the intermediate substrate holding chamber is disposed on a side wall of the substrate transfer chamber. Therefore, by using a heat resistant substrate holder or the like as the first substrate holding means disposed within the intermediate substrate holding chamber, the intermediate substrate holding chamber can be used as a substrate cooling chamber for cooling a high-temperature substrate which has been processed in the substrate processing chamber.

Further, since the intermediate substrate holding chamber can be used as a chamber for temporarily accommodating a substrate on the transfer path from a cassette to the substrate processing chamber, for temporarily accommodating a substrate on the transfer path from the substrate processing chamber to a cassette, or for temporarily accommodating both a substrate on the transfer path from a cassette to the substrate processing chamber and a substrate on the transfer path from the substrate processing chamber to a cassette, there is no need for providing a cassette chamber on a side wall of the substrate transfer chamber. As a result, the number of chambers to be disposed on side walls of the substrate transfer chamber is reduced, and the area occupied by the substrate processing apparatus within a clean room can be reduced accordingly. Further, the number of sides of the wafer transfer chamber is reduced, and the size of the substrate transfer chamber is reduced accordingly, resulting in a decrease in the area occupied by the substrate transfer chamber. This also reduces the area occupied by the substrate processing apparatus within the clean room.

As the number of sides of the substrate transfer chamber is reduced, the cost of manufacture of the substrate transfer chamber is reduced. As the number of sides increases, the required multidirectional maintenance space increases accordingly. By contrast, according to the present invention, the number of sides of the substrate transfer chamber can be reduced, and the required multidirectional maintenance space can be reduced accordingly. Further, a reduction in the number of sides of the substrate transfer chamber decreases the distance over which a connection is made between the substrate transfer chamber and another substrate transfer chamber or the like. As a result, a substrate can be transferred between the substrate transfer chamber and another substrate transfer chamber or the like without providing a substrate transfer device at a connecting section therebetween; thus the substrate processing apparatus can be made simpler in structure and manufactured at lower cost accordingly.

Since the substrate transfer chamber and the intermediate substrate holding chamber can be depressurized, the oxygen concentration therein can be reduced to a minimal level, thereby suppressing oxidation of a substrate in the substrate transfer chamber and the intermediate substrate holding chamber.

The second valve is disposed between the substrate transfer chamber and the intermediate substrate holding chamber, and the second valve is capable of providing hermetic vacuum isolation between the substrate transfer chamber and the intermediate substrate holding chamber when closed and allowing a substrate to pass therethrough when opened. Therefore, the substrate transfer chamber and the intermediate substrate holding chamber can be maintained under vacuum independently of each other, and also a substrate can move between the substrate transfer chamber and the intermediate substrate holding chamber. This second valve is preferably a gate valve.

Further, the third valve is preferably disposed between the intermediate substrate holding chamber and the atmospheric pressure section, and the third valve is capable of maintaining the intermediate substrate holding chamber under vacuum in isolation from the atmospheric pressure section when closed and allowing a substrate to pass therethrough when opened. Therefore, the intermediate substrate holding chamber can be maintained under vacuum in isolation from the atmospheric pressure section, and also a substrate can move between the intermediate substrate holding chamber and the atmospheric pressure section.

As described above, since the second and third valves are disposed at the intermediate substrate holding chamber and the intermediate substrate holding chamber can be depressurized independently of the substrate transfer chamber, the intermediate substrate holding chamber can function as a load-lock chamber when a substrate is transferred between the atmospheric pressure section and the substrate transfer chamber maintained under reduced pressure.

As described above, since the intermediate substrate holding chamber can be used as a substrate cooling chamber as well as a load-lock chamber, it is not necessary to provide a substrate cooling chamber and a cassette chamber on side walls of the substrate transfer chamber, and a cassette can be placed within the atmospheric pressure chamber.

Since the second valve is disposed between the substrate transfer chamber and the intermediate substrate holding chamber, the pressure of the intermediate substrate holding chamber can be restored to atmospheric pressure while the substrate transfer chamber is maintained under reduced pressure; and a substrate contained in the intermediate substrate holding chamber naturally cools down while the pressure of the intermediate substrate holding chamber is being restored to atmospheric pressure, so that the temperature of the substrate can be lowered to a sufficient level before the substrate leaves the intermediate substrate holding chamber. Consequently, when the substrate is subsequently taken out into atmospheric environment, it can be prevented from being oxidized or contaminated by atmospheric environment. In this manner, a step of restoring pressure to atmospheric pressure and a step of cooling a substrate can be simultaneously performed within the intermediate substrate holding chamber, and subsequently the cooled substrate can be transferred under atmospheric pressure to a cassette. A cassette which contains substrates can then be taken out from the substrate processing apparatus.

Conventionally, since a cassette chamber and a cooling chamber are disposed on side walls of the substrate transfer chamber, the first substrate transfer means disposed within the substrate transfer chamber must also be used for transferring a substrate between the cassette chamber and the cooling chamber. By contrast, in the present invention, the second substrate transfer means, not the first substrate transfer means disposed within the substrate transfer chamber, can be used for transferring a substrate between the intermediate substrate holding chamber and a cassette, thereby reducing time required for transferring a substrate. Also, in the present invention, within the atmospheric pressure section are disposed the cassette holding means and the second substrate transfer means capable of transferring a substrate between a cassette held by the cassette holding means and the intermediate substrate holding chamber. Thus, the cassette holding means and the second substrate transfer means can be made simpler in structure as compared with the case where they are disposed in a vacuum environment.

A cassette is preferably a cassette for carrying substrates into and/or carrying them out from the substrate processing apparatus.

Further, the first valve is disposed between the substrate processing chamber and the substrate transfer chamber, and the first valve is capable of providing hermetic vacuum isolation between the substrate processing chamber and the substrate transfer chamber when closed and allowing a substrate to pass therethrough when opened. Therefore, the substrate processing chamber and the substrate transfer chamber can be maintained under vacuum independently of each other, and also a substrate can move between the substrate processing chamber and the substrate transfer chamber. This first valve is preferably a gate valve.

A substrate is preferably a semiconductor wafer. In this case, the substrate processing apparatus functions as a semiconductor wafer processing apparatus.

A substrate may also be a glass substrate for use in a liquid crystal display device.

In the substrate processing chamber, there are preferably performed processes including: the deposition of various films, including insulating films, metal wiring films, polycrystalline silicon films, and amorphous silicon films, by various CVD (Chemical Vapor Deposition) methods such as a plasma enhanced CVD method, a hot wall CVD method, a photo-assisted CVD method, and the like; etching; heat treatment such as annealing and the like; epitaxial growth; and diffusion.

Preferably, heat resistant substrate holding means is disposed within the intermediate substrate holding chamber, whereby the intermediate substrate holding chamber can be used as a substrate cooling chamber for cooling a high-temperature substrate which has been processed in the substrate processing chamber.

Preferably, a heat resistant substrate holding device made of quartz, glass, ceramics, or metal is disposed within the intermediate substrate holding chamber, whereby the intermediate substrate holding chamber can be used as a substrate cooling chamber for cooling a high-temperature substrate which has been processed in the substrate processing chamber and whereby even when the intermediate substrate holding chamber is maintained under vacuum, impurities are not outgassed from the substrate holding device, thereby maintaining clean the atmosphere within the intermediate substrate holding chamber. Ceramics are preferably sintered SiC, or sintered SiC coated with $SiO_2$ by CVD or the like.

Preferably, the substrate processing chamber, the substrate transfer chamber, and the intermediate substrate holding chamber can be depressurized independently of one another. This allows the following: a substrate can be prevented from oxidizing within the substrate transfer chamber and the intermediate substrate holding chamber; the intermediate substrate holding chamber can be used not only as a load-lock chamber but also as a substrate processing chamber for processing a substrate under reduced pressure; and after the substrate processing chamber is depressurized, the atmosphere therein can be replaced with a predetermined atmospheric gas, thereby establishing a highly pure gaseous atmosphere therein.

Preferably, the substrate processing chamber is a substrate processing chamber for processing a substrate under reduced pressure.

The substrate processing chamber may be a substrate processing chamber for processing a substrate under atmospheric pressure.

Preferably, a plurality of substrate processing chambers for processing a substrate, are disposed such that they are stacked in the vertical direction on the first side wall of the substrate transfer chamber. This reduces the area occupied by the substrate processing chambers within a clean room. Also, the number of sides of the substrate transfer chamber can be reduced thereby to reduce the size of the substrate transfer chamber, resulting in a reduction in the area occupied by the substrate transfer chamber. Thus, the substrate processing apparatus occupies less area within the clean room.

As the number of sides of the substrate transfer chamber is reduced, the cost of manufacture of the substrate transfer chamber is reduced, and the required multidirectional maintenance space is also reduced. Further, the distance over which a connection is made between the substrate transfer chamber and another substrate transfer chamber or the like can also be reduced. This allows a substrate to be transferred between the substrate transfer chamber and another substrate transfer chamber or the like without providing a substrate transfer device at a connecting section therebetween; thus the substrate processing apparatus can accordingly be made simpler in structure and manufactured at lower cost.

Preferably, these substrate processing chambers are all used for processing a substrate under reduced pressure.

As another preferable way, at least one of these substrate processing chambers may be used for processing a substrate under atmospheric pressure, and the remaining substrate processing chambers may be used for processing a substrate under reduced pressure.

The first substrate transfer means is preferably a substrate transfer device for transferring a substrate in a horizontal direction, more preferably an articulated robot.

Preferably, an elevator is disposed which can hoist and lower the first substrate transfer means. The elevator is disposed preferably outside the substrate transfer chamber so as to not contaminate the atmosphere within the substrate transfer chamber.

Preferably, the second substrate holding means can hold a plurality of substrates, the first substrate holding means can hold a plurality of substrates, and the pitch of substrates held by the first substrate holding means is substantially identical to that of substrates held by the second substrate holding means.

In this case, since the second substrate holding means disposed within the substrate processing chamber can hold a plurality of substrates, the substrate processing efficiency of the substrate processing chamber can be increased.

In this case, since the first substrate holding means disposed within the intermediate substrate holding chamber can hold a plurality of substrates and the pitch of substrates held by the first substrate holding means is substantially identical to that of substrates held by the second substrate holding means, the structure of the first substrate transfer means disposed within the substrate transfer chamber can be simplified. Preferably, the first substrate transfer means can transfer a plurality of substrates at one time under reduced pressure.

In the case where the pitch of substrates held by the first substrate holding means is made substantially identical to that of substrates held by the second substrate holding means, there is no need for changing the pitch of substrates while transferring substrates, even when the first substrate transfer means adopts the structure capable of transferring a plurality of substrates at one time under reduced pressure. As a result, the structure of the first substrate transfer means becomes simple, and contamination of vacuum can be prevented. Further, since a plurality of substrates can be transferred at one time, the efficiency of transferring substrates increases.

By contrast, if the pitch of substrates is made variable on the transfer path under reduced pressure, the structure of transfer means will become complicated, and more than twice as much cost and space will be required as compared with the use of the transfer means under atmospheric pressure. Moreover, due to an increase in the number of mechanisms, contaminants generated from a driving shaft and the like become more likely to scatter. This results in a failure to maintain a predetermined degree of vacuum and is likely to introduce a problem of particles and to cause contamination of a substrate. Since particles are generated, within the substrate transfer chamber, adjacent to the substrate processing chamber, the effect of particles is particularly large. If in order to avoid such a problem, substrates are transferred one by one between the first substrate holding means and the second substrate holding means, throughput will deteriorate. If in order to improve throughput, the transferring speed of a substrate transfer robot is increased, the number of operations per unit time of the substrate transfer robot will increase, resulting in a decrease in service life of the apparatus and introduction of a problem of particles.

In order to concurrently process, for example, to concurrently deposit a film on a plurality of substrates within the substrate processing chamber, these substrates must be arranged not at the pitch of grooves in a cassette, but at a pitch which is determined in consideration of a gas flow and the like within the substrate processing chamber, so as to maintain uniformity of a film thickness and the like. Therefore, it is preferable that the pitch of substrates be changed from the pitch of the grooves in the cassette at a certain point of transfer of substrates.

In the present invention, the second substrate transfer means preferably has a structure capable of transferring a plurality of substrates at one time and changing the pitch of these substrates. Since the second substrate transfer means is used under atmospheric pressure, even when the pitch of substrates can be made changeable, the second substrate transfer means is simpler in structure and can be manufactured at lower cost as compared with that for use under vacuum, and the generation of particles can be suppressed.

By adopting the above-mentioned method of transferring a plurality of substrates at one time while the pitch of substrates is variable during transfer under atmospheric pressure and fixed during transfer under reduced pressure, the cost of manufacture of transfer devices can be reduced, the size of the transfer devices can be reduced, and the generation of particles can be suppressed so as to provide a clean environment for transfer of substrates. Further, since a plurality of substrates are transferred at one time, throughput improves. Since the pitch of substrates is variable, the pitch can be changed so as to process substrates at high precision within the substrate processing chamber.

A plurality of intermediate substrate holding chambers may be disposed on a side wall of the substrate transfer chamber, whereby while a certain intermediate substrate holding chamber is used for cooling a substrate contained therein, another intermediate substrate holding chamber may be used for transferring a substrate to the substrate processing chamber, thereby saving time.

Preferably, a plurality of intermediate substrate holding chambers are disposed such that they are stacked in the vertical direction on the second side wall of the substrate transfer chamber. This reduces the area occupied by the intermediate substrate holding chambers within a clean room. Also, the number of sides of the substrate transfer chamber can be reduced to thereby reduce the size of the substrate transfer chamber, resulting in a reduction in the area occupied by the substrate transfer chamber. Thus, the substrate processing apparatus occupies less area within the clean room.

As the number of sides of the substrate transfer chamber is reduced, the cost of manufacture of the substrate transfer chamber is reduced, and the required multidirectional maintenance space is also reduced. Further, when a plurality of substrate processing apparatuses are disposed, the distance over which a connection is made between the substrate transfer chamber and another substrate transfer chamber or the like can be reduced. This allows a substrate to be transferred between the substrate transfer chamber and another substrate transfer chamber or the like without providing a substrate transfer device at a connecting section therebetween; thus the substrate processing apparatus can accordingly be made simpler in structure and manufactured at lower cost. Further, the maintenance space for one substrate processing apparatus does not interfere with that for another substrate processing apparatus; therefore a plurality of substrate processing apparatuses can be efficiently arranged.

Two kinds of intermediate substrate holding chambers, one for incoming substrates and the other for outgoing substrates, may be separately disposed. This allows two kinds of intermediate substrate holding chambers to be alternately used, thereby saving time.

Preferably, the first substrate holding means can hold at least twice as many substrates as those to be processed at one time within each of the substrate processing chambers.

Preferably, the first substrate holding means can hold at least twice as many substrates as those to be held by the second substrate holding means, whereby the first substrate holding means can hold at least twice as many substrates as those to be processed at one time within each of the substrate processing chambers.

As a result, substrates can be efficiently transferred between the substrate processing chamber and a cassette, thereby improving throughput.

Preferably, the first and second side walls of the substrate transfer chamber are opposed to each other so as to arrange on a substantially straight line the substrate processing chamber, the substrate transfer chamber, and the intermediate substrate holding chamber. This minimizes the number of sides of the substrate transfer chamber; for example, the substrate transfer chamber may assume a rectangular shape.

Preferably, the substrate transfer chamber has a rectangular shape as viewed from above, thereby reducing the size of the substrate transfer chamber and thus reducing the area occupied by the substrate transfer chamber. Thus, the substrate processing apparatus occupies less area within a clean room. By adopting the rectangular shape, the cost of manufacture of the substrate transfer chamber is reduced, and a required maintenance space is also reduced. Further, the distance over which a connection is made between the substrate transfer chamber and another substrate transfer chamber or the like can be reduced. This allows a substrate to be readily transferred between the substrate transfer chamber and another substrate transfer chamber or the like without providing a substrate transfer device at a connecting section therebetween; thus the substrate processing apparatus can accordingly be made simpler in structure and manufactured at lower cost. A plurality of substrate processing units, each comprising the structure such that the substrate processing chamber, the substrate transfer chamber, and the intermediate substrate holding chamber are arranged on a substantially straight line, can be readily arranged in parallel so that they occupy less area.

Preferably, the cassette holding means is located opposite to the substrate transfer chamber with respect to the intermediate substrate holding chamber.

Preferably, the second substrate transfer means is disposed between the intermediate substrate holding chamber and the cassette holding means. The second substrate transfer means is preferably cassette transfer and substrate transfer means capable of transferring the substrate between the cassette held by the cassette holding means and the intermediate substrate holding chamber, as well as capable of transferring the cassette to and from the cassette holding means.

The first substrate holding means preferably has a substrate supporting groove which is open-ended in the front and rear directions of the first substrate holding means so as to carry in a substrate from either the front or rear side of the first substrate holding means, as well as to take out a substrate from either the front or rear side of the first substrate holding means.

Preferably, a housing is disposed for accommodating the substrate processing chamber, the substrate transfer chamber, the intermediate substrate holding chamber, the second substrate transfer means, and the cassette holding means. By disposing the second substrate transfer means and the cassette holding means within the housing, the surface of a substrate placed in a cassette and the surface of a substrate being transferred by the second substrate transfer means can be maintained clean.

Preferably, a cassette stage is disposed under the cassette holding means within the housing, for holding a cassette which has been carried into the housing, for holding a cassette to be carried out from the housing, or for holding a cassette which has been carried into the housing as well as holding a cassette to be carried out from the housing. Therefore, the substrate in the cassette held by the cassette holding means is prevented from being affected by particles which enter the housing from outside while a cassette is being transferred to the cassette stage or which enter the housing from outside through a cassette IN/OUT opening through which a cassette enters/leaves the housing.

Preferably, the cassette transfer and substrate transfer means is mounted on the elevator so as to transfer a cassette between the cassette stage and the cassette holding means.

Preferably, there are provided a plurality of substrate processing units, each comprising the substrate processing chamber, the substrate transfer chamber, the first substrate transfer means, and the intermediate substrate holding chamber; and these substrate processing units are interconnected via a second intermediate substrate transfer chambers each disposed between adjacent substrate transfer chambers.

In the above-mentioned plurality of substrate processing units which are interconnected via second intermediate substrate transfer chambers each disposed between adjacent substrate transfer chambers, the substrate transfer chambers preferably have a rectangular shape as viewed from above. In this case, since the distance between adjacent substrate transfer chambers can be made relatively short, there is no need for providing a substrate transfer device in each of the second intermediate substrate transfer chambers.

According to the present invention, there is also provided a substrate processing apparatus, comprising a substrate transfer chamber;
a plurality of substrate processing chamber disposed on a side wall of the substrate transfer chamber, the plurality of substrate processing chamber being stacked in the vertical direction and being seperated by one another.
Preferably, the substrate transfer chamber is a chamber for transferring a substrate under a vacuum condition.

Preferably, this substrate processing apparatus further comprises a plurality of gate valves respectively disposed between the plurality of substrate processing chambers and the substrate transfer chamber.

Still preferably, the substrate processing apparatus further comprises a plurality of substrate holding chambers disposed on a second side wall of the substrate transfer chamber, the plurality of substrate holding chambers being stacked in the vertical direction and being seperated by one another; and
a plurality of second gate valves respectively disposed between the plurality of substrate holding chambers and the substrate transfer chamber.

BRIEF DESCRIPTION OF THE DRAWINGS

The above and further objects, features and advantages of the present invention will become more apparent from the following detailed description taken in conjunction with the accompanying drawings, wherein:

FIG. 9 is a schematic cross-sectional view for explaining the operation of transferring wafers in the semiconductor processing apparatus according to the first embodiment;

DESCRIPTION OF THE PREFERRED EMBODIMENTS

First Embodiment

Figure 3:
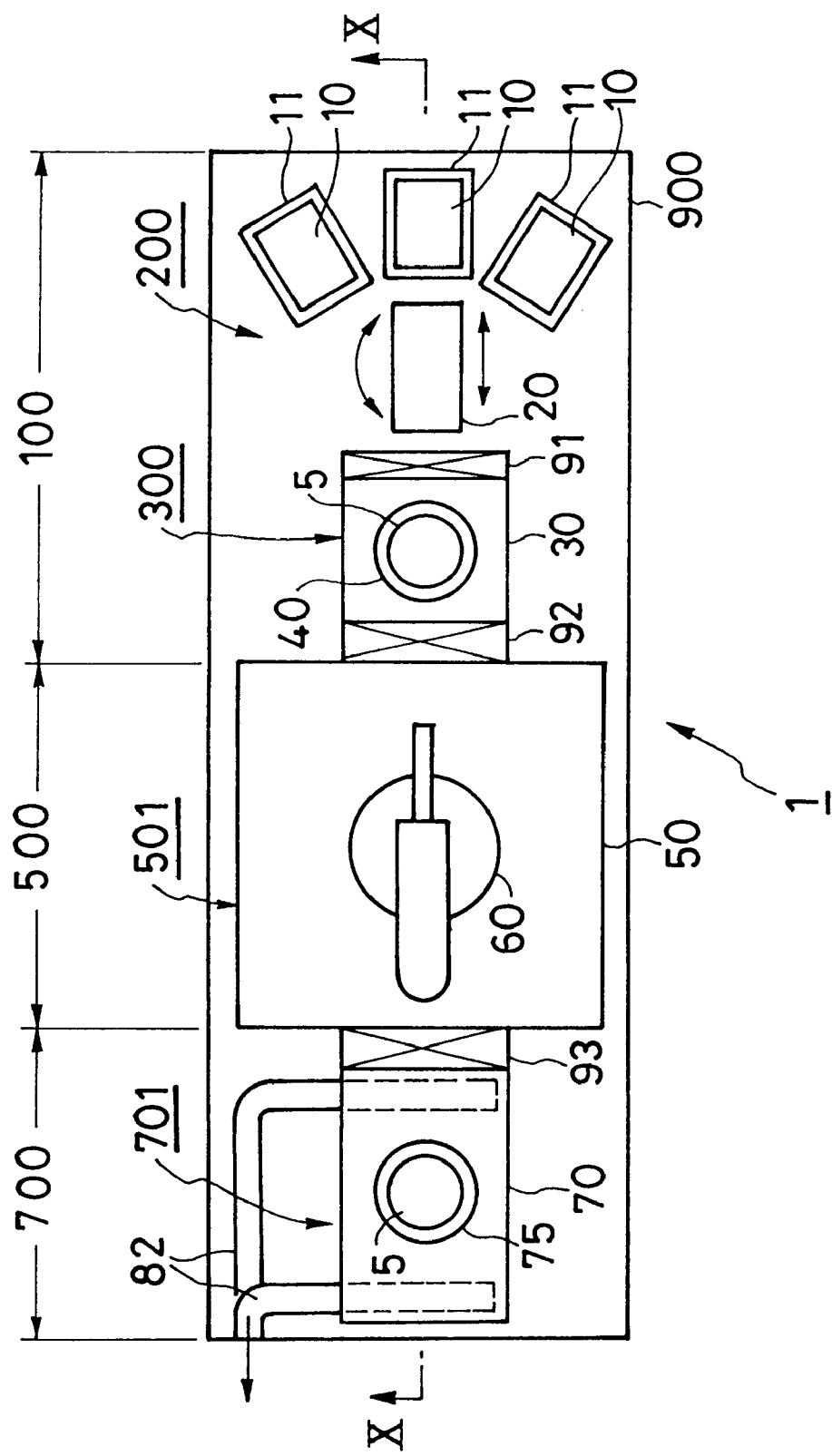
FIG. 3 is a plan view for explaining a semiconductor wafer processing apparatus according to a first embodiment of the present invention.
Figure 4:
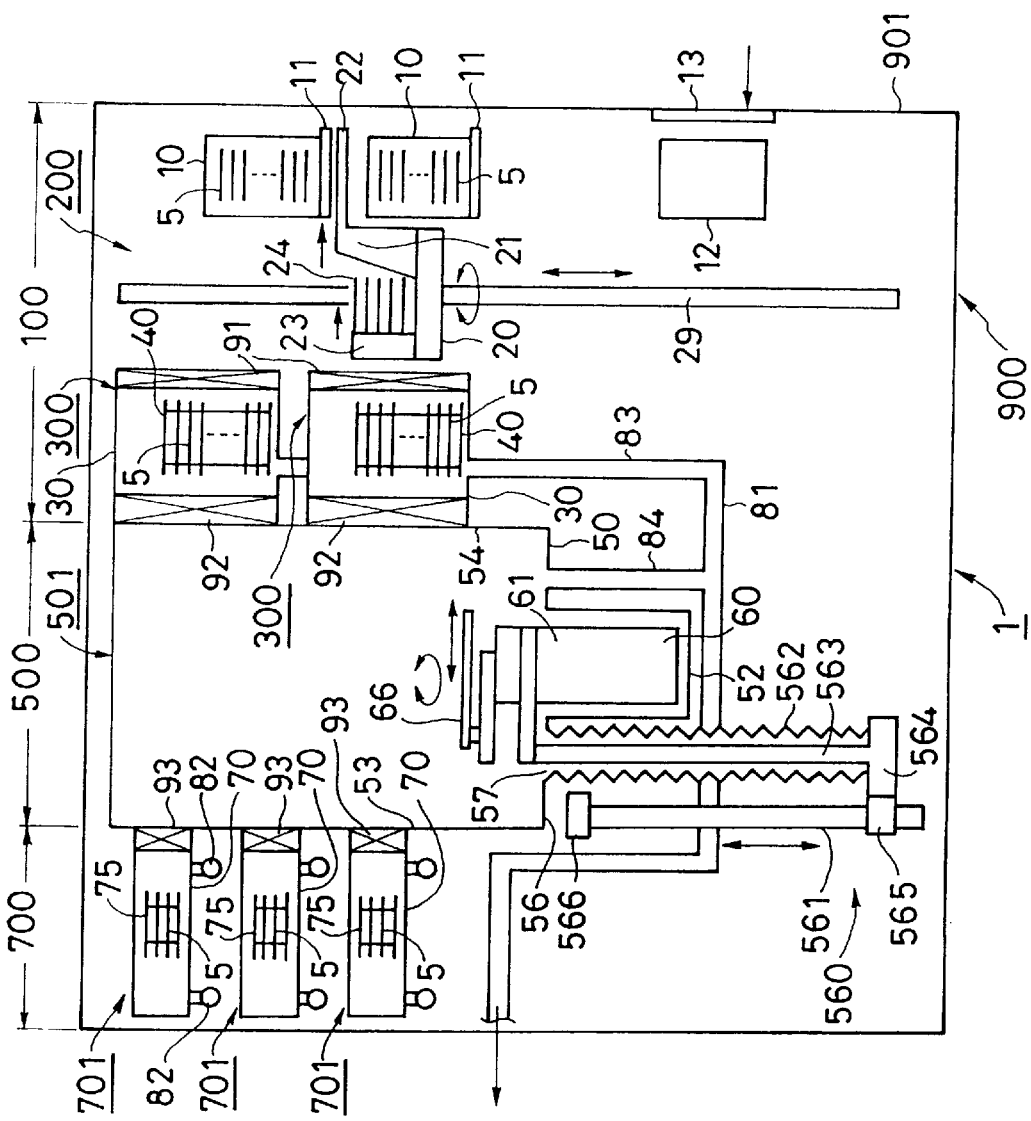
FIG. 4 is a cross-sectional view taken along the line X—X in FIG. 3.

FIG. 3 is a plan view for explaining a semiconductor wafer processing apparatus according to a first embodiment of the present invention. FIG. 4 shows a cross-sectional view taken along the line X—X in FIG. 3.

A semiconductor wafer processing apparatus 1 of the present embodiment is composed of a processing section 700, a transfer section 500, and a front section 100.

The processing section 700 is composed of a plurality of processing modules 701, each including a reaction chamber 70 and a gate valve 93. The transfer section 500 is composed of a transfer module 501, which includes a wafer transfer chamber 50 and a wafer-transfer vacuum robot 60. The front section 100 is composed of a plurality of load-lock modules 300 and an atmospheric pressure section 200. Each load-lock module 300 is composed of an intermediate wafer holding chamber 30, a gate valve 92, and a front door valve 91. In the atmospheric pressure section 200, there are disposed cassette shelves 11, each being used for mounting a cassette 10 thereon, and a cassette transfer and wafer transfer device 20.

The plurality of reaction chambers 70 are arranged in the vertical direction and connected to a wall 53 of the wafer transfer chamber 50. The gate valve 93 is disposed between each reaction chamber 70 and the wafer transfer chamber 50. Each reaction chamber 70 is adapted to be independently evacuated via an exhaust pipe 82. Within each reaction chamber 70 is placed a wafer boat 75 capable of carrying a plurality of (two in the present embodiment) semiconductor wafers 5 so as to process a plurality of wafers 5 at one time, thereby increasing the wafer processing efficiency. The pitch of wafers 5 carried in the wafer boat 75 is determined in consideration of a gas flow and the like within the reaction chamber 70; for example, when a process of depositing a film is to be performed within the reaction chamber 70, the pitch is determined so as to maintain the uniformity of film thickness within a predetermined range.

In the reaction chamber 70 there are performed processes including: the deposition of various films, including insulating films, metal wiring films, polycrystalline silicon films, and amorphous silicon films, by various kinds of CVD such as plasma enhanced CVD, hot wall CVD, photo assisted CVD, and the like; etching; heat treatment such as annealing and the like; epitaxial growth; diffusion.

Since the plurality of reaction chambers 70 are disposed in vertical layers on the wall 53 of the wafer transfer chamber 50, the area occupied by the reaction chambers 70 within a clean room can be reduced. Also, the number of sides of the wafer transfer chamber 50 can be reduced thereby to reduce the size of the wafer transfer chamber 50, resulting in a reduction in the area occupied by the wafer transfer chamber 50. Thus, the semiconductor wafer processing apparatus 1 occupies less area within the clean room.

As the number of sides of the wafer transfer chamber 50 is reduced, the cost of manufacture of the wafer transfer chamber 50 is reduced, and the required multidirectional maintenance space is also reduced. Further, in the case where another wafer transfer chamber is connected to the wafer transfer chamber 50, the distance between the wafer transfer chamber 50 and another wafer transfer chamber or the like can be reduced. This allows a wafer to be transferred between the wafer transfer chamber 50 and another wafer transfer chamber or the like without providing a wafer transfer device at a connecting section therebetween; thus the semiconductor wafer processing apparatus 1 can accordingly be made simpler in structure and manufactured at lower cost.

The plurality of intermediate wafer holding chambers 30 are disposed in vertical layers on a wall 54 of the wafer transfer chamber 50. The gate valve 92 is disposed between each intermediate wafer holding chamber 30 and the wafer transfer chamber 50. The front door valve 91 is disposed between each intermediate wafer holding chamber 30 and the atmospheric pressure section 200. Each intermediate wafer holding chamber 30 is adapted to be independently evacuated via exhaust pipes 83 and 81.

Figure 5:
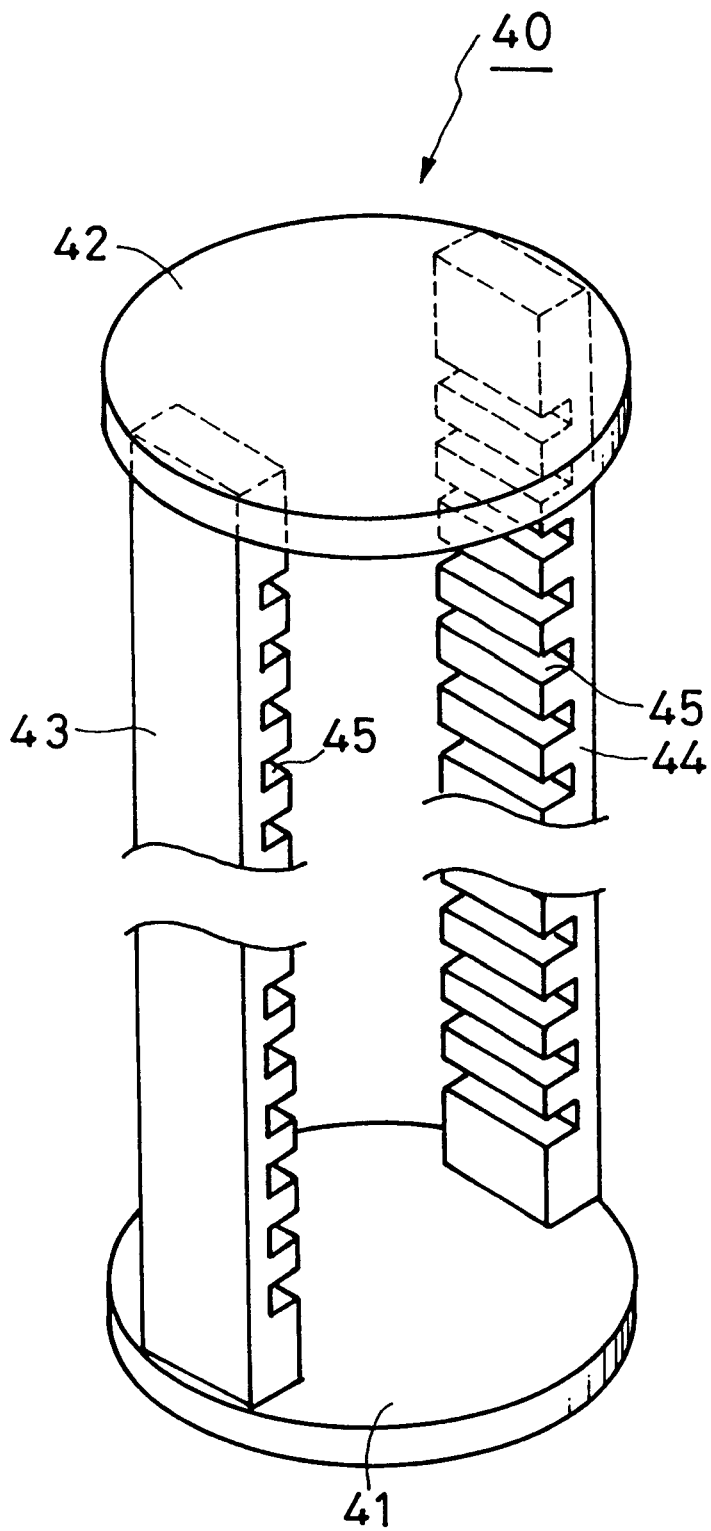
FIG. 5 is a schematic perspective view for explaining a wafer holder for use in the first through seventh embodiments of the present invention.

A wafer holder 40 is placed within the intermediate wafer holding chamber 30. FIG. 5 is a schematic perspective view for explaining the wafer holder 40. The wafer holder 40 has upper and lower disk-like column supporting plates 41 and 42 and two prismatic columns 43 and 44, which are held between the plates 41 and 42. A plurality of wafer supporting grooves 45 are formed in each of the columns 43 and 44, and the columns 43 and 44 stand such that respective grooves 45 face each other. The both ends of the grooves 45 are open so as to allow wafers to be loaded from both sides of the wafer holder 40 and to be unloaded to both sides thereof. The wafer holder 40 is made of quartz.

The pitch of the wafer supporting grooves 45 of the wafer holder 40, i.e. the pitch of wafers 5 held in the wafer holder 40 is made equal to that of wafers 5 mounted in the wafer boat 75 in the reaction chamber 70. The pitch of the wafer supporting grooves 45 of the wafer holder 40 is larger than that of grooves for holding wafers within the cassette 10.

The number of the wafer supporting grooves 45 of the wafer holder 40, i.e. the number of wafers 5 which the wafer holder 40 can hold is at least twice the number of wafers 5 which the wafer boat 7 within the reaction chamber 70 can carry, i.e. at least twice the number of wafers 5 which can be processed at one time within the reaction chamber 70. Thus, the wafers 5 can be efficiently transferred between the reaction chamber 70 and the cassette 10, resulting in improved throughput.

Since the wafer holder 40 is made of quartz, even when the intermediate wafer holding chamber 30 is maintained under vacuum, impurities are not outgassed from the wafer holder 40, thereby maintaining clean the atmosphere within the intermediate wafer holding chamber 30.

Since the wafer holder 40 is made of quartz and thus has excellent heat resistance, the high-temperature wafer 5 which has been processed in the reaction chamber 70 can be cooled while being held in the wafer holder 40. The wafer holder 40 can thus be used for cooling wafers 5, so that the intermediate wafer holding chamber 30 functions as a wafer cooling chamber. Accordingly, there is no need for providing a separate cooling chamber on a side wall of the wafer transfer chamber 50 in order to cool the high-temperature wafer 5 which has been processed in the reaction chamber 70, whereby the area occupied by the semiconductor wafer processing apparatus 1 within a clean room can be reduced by the area which would otherwise be occupied by the cooling chamber. Also, the number of sides of the wafer transfer chamber 50 can be reduced thereby to reduce the size of the wafer transfer chamber 50, resulting in a reduction in the area occupied by the wafer transfer chamber 50. Thus, the semiconductor wafer processing apparatus 1 occupies less area within the clean room. Further, the cost of manufacture of the wafer transfer chamber 50 can be reduced.

Since the wafer holder 40 temporarily accommodates wafers 5 on the transfer path from the cassette 10 to the wafer processing chamber 70, temporarily accommodates wafers 5 on the transfer path from the wafer processing chamber 70 to the cassette 10, or temporarily accommodates wafers 5 on the transfer path from the cassette 10 to the wafer processing chamber 70 as well as wafers 5 on the transfer path from the wafer processing chamber 70 to the cassette 10, there is no need for providing a cassette chamber for accommodating the cassette 10 on a side wall of the wafer transfer chamber 50. As a result, the number of chambers to be disposed on side walls of the wall transfer chamber 50 is reduced, and the area occupied by the wafer processing apparatus 1 within a clean room can be reduced accordingly. Further, the number of sides of the wafer transfer chamber 50 is reduced, and the size of the wafer transfer chamber 50 is reduced accordingly, resulting in a decrease in the area occupied by the wafer transfer chamber 50. This also reduces the area occupied by the semiconductor wafer processing apparatus 1 within the clean room. Further, the cost of manufacture of the wafer transfer chamber 50 is reduced.

In the present embodiment, since the plurality of intermediate wafer holding chambers 30 are disposed on the wall 54 of the wafer transfer chamber 50, while a certain intermediate wafer holding chamber 30 is used for cooling wafers 5, another intermediate wafer holding chamber 30 may be used for transferring wafers 5 to the reaction chamber 70, thereby saving time. Also, two kinds of the intermediate wafer holding chambers 30, one for incoming wafers 5 and the other for outgoing wafers 5, may be separately provided. This allows two kinds of the intermediate wafer holding chambers 30 to be alternately used, thereby saving time. Further, a certain intermediate wafer holding chamber 30 may be used for monitor wafers, and another intermediate wafer holding chamber 30 may be used for process wafers which will become actual products.

Since the plurality of intermediate wafer holding chambers 30 are disposed in vertical layers on the wall 54 of the wafer transfer chamber 50, the area occupied by the intermediate wafer holding chambers 30 within a clean room can be reduced. Also, the number of sides of the wafer transfer chamber 50 can be reduced thereby to reduce the size of the wafer transfer chamber 50, resulting in a reduction in the area occupied by the wafer transfer chamber 50. Thus, the semiconductor wafer processing apparatus 1 occupies less area within the clean room. Further, the cost of manufacture of the wafer transfer chamber 50 is reduced.

Since the gate valve 92 is disposed between the wafer transfer chamber 50 and the intermediate wafer holding chamber 30, the pressure of the intermediate wafer holding chamber 30 can be restored to atmospheric pressure while the wafer transfer chamber 50 is maintained under reduced pressure. Therefore, each wafers 5 contained in the intermediate wafer holding chamber 30 naturally cools down while the pressure of the intermediate wafer holding chamber 30 is being restored to atmospheric pressure, so that the temperature of each wafer 5 is lowered to a sufficient level before the wafer 5 leaves the intermediate wafer holding chamber 30. Accordingly, even when the wafers 5 are subsequently taken out into atmospheric environment, the wafers 5 are prevented from being oxidized or contaminated by atmospheric environment. In this manner, a step of restoring pressure to atmospheric pressure and a step of cooling wafers 5 are simultaneously performed within the intermediate wafer holding chamber 30, and subsequently the cooled wafers 5 are transferred under atmospheric pressure to the cassette 10. The cassette 10 which contains the wafers 5 is then delivered out from the wafer processing apparatus 1.

Figure 1:
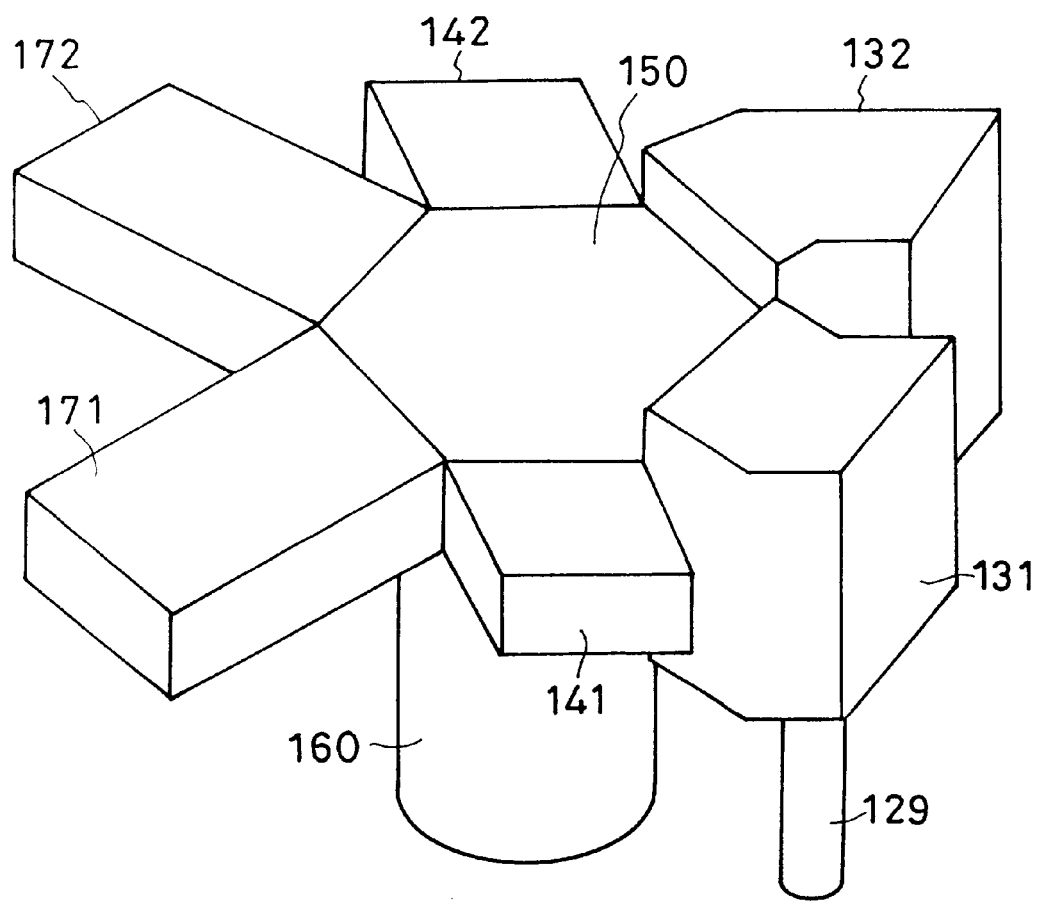
FIG. 1 is a perspective view for explaining a conventional semiconductor wafer processing apparatus.
Figure 2:
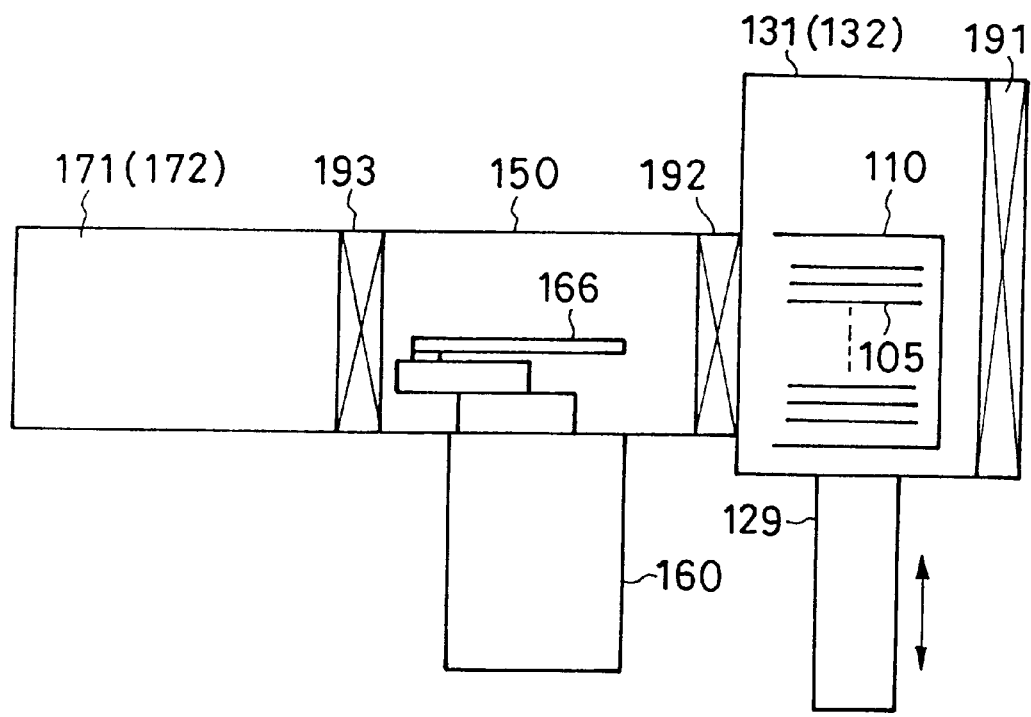
FIG. 2 is a cross-sectional view for explaining the conventional semiconductor wafer processing apparatus.

In the conventional apparatus shown in FIGS. 1 and 2, since cassette chambers 131 and 132 and cooling chambers 141 and 142 are disposed on side walls of a wafer transfer chamber 150, a wafer-transfer vacuum robot 160 disposed within the wafer transfer chamber 150 must be used for transferring a wafer between the cassette chambers 131 and 132 and the cooling chambers 141 and 142. By contrast, in the present embodiment, the cassette transfer and wafer transfer device 20, not the wafer-transfer vacuum robot 60 disposed within the wafer transfer chamber 50, is used for transferring wafers 5 between the intermediate wafer holding chamber 30 and the cassettes 10, thereby reducing time required for transferring wafers 5. Also, in the present embodiment, since the cassette transfer and wafer transfer device 20 is disposed within the atmospheric pressure section 200, the cassette transfer and wafer transfer device 20 can be made simpler in structure as compared with the case where it is disposed in a vacuum atmosphere.

The wafer transfer chamber 50 is adapted to be evacuated via the exhaust pipes 84 and 81. Also, the plurality of reaction chambers 70, the wafer transfer chamber 50, and the plurality of intermediate wafer holding chambers 30 are adapted to be evacuated independently of one another.

Since the wafer transfer chamber 50 and the intermediate wafer holding chamber 30 can be depressurized, the oxygen concentration therein can be reduced to an ultimate level, thereby suppressing oxidation of wafers 5 in the wafer transfer chamber 50 and in the intermediate wafer holding chamber 30.

Since the reaction chambers 70 can be independently evacuated, each of the reaction chambers 70 can function as a reaction chamber for processing wafers 5 under reduced pressure. Further, after the reaction chamber 70 is depressurized, the atmosphere therein can be replaced with a predetermined atmospheric gas, thereby establishing a highly pure gaseous atmosphere therein.

In the present embodiment, the plurality of reaction chambers 70 are all used for processing wafers 5 under reduced pressure. However, the plurality of reaction chambers 70 may all be used for processing wafers 5 under atmospheric pressure, or at least one of these reaction chambers 70 may be used for processing wafers 5 under atmospheric pressure while the remaining reaction chambers 70 may be used for processing wafers 5 under reduced pressure.

Figure 6A:
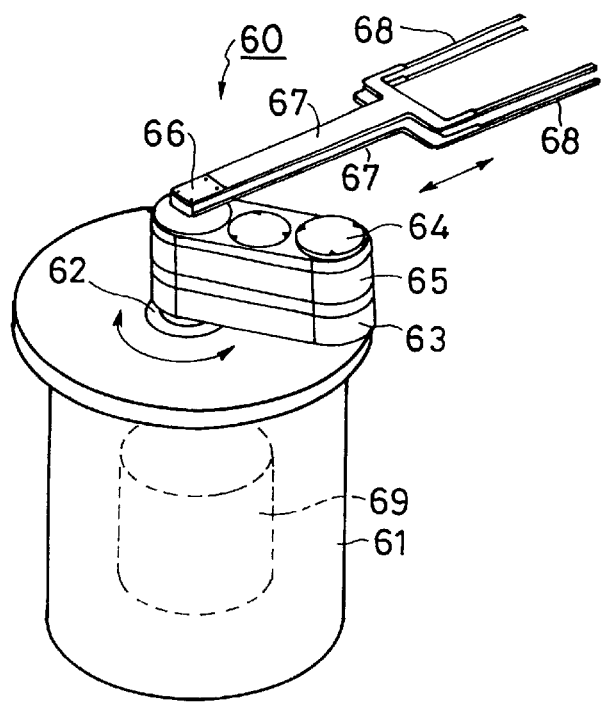
FIGS. 6A and 6B are schematic perspective views for explaining a wafer-transfer vacuum robot for use in the first through seventh embodiments of the present invention.
Figure 6B:
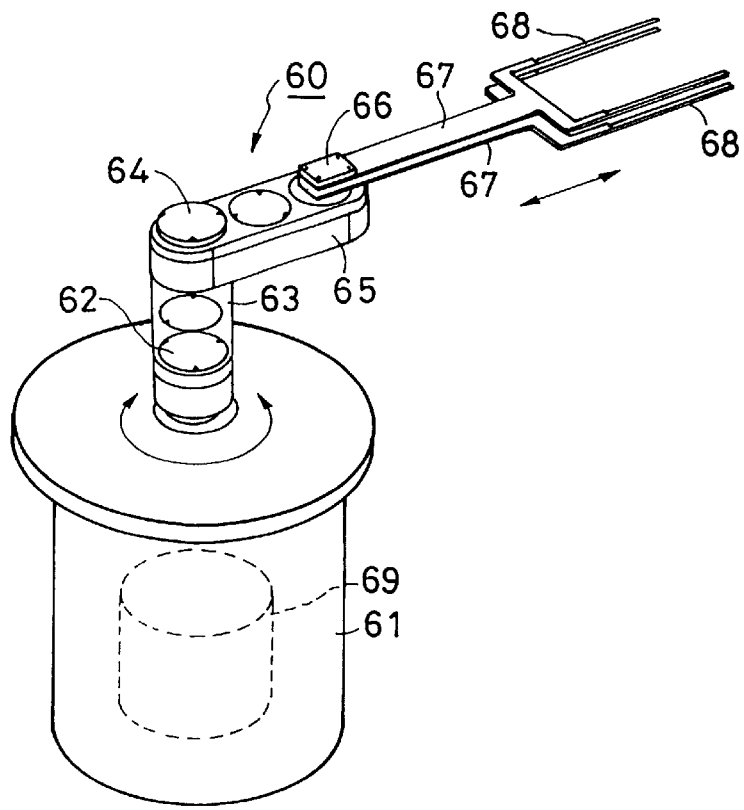

The wafer-transfer vacuum robot 60 is disposed within the wafer transfer chamber 50. FIGS. 6A and 6B are schematic perspective views for explaining the wafer-transfer vacuum robot 60. The wafer-transfer vacuum robot 60 is an articulated robot and is composed of arms 63, 65, and 67, each swingable in a corresponding horizontal plane, and rotational axles 62, 64, and 66 for swinging the respective arms. The robot 60 also include a two-axis driving unit 69 for rotating the rotational axle 62, a gear mechanism (not shown) for transmitting the rotation of the rotational axle 62 to the rotational axles 64 and 66, and a driving unit container 61 for accommodating the driving unit 69. The tip of the arm 67 is formed into a wafer mounting arm 68 for mounting wafers 5 thereon. As the rotational axle 62 rotates, the arms 63, 65, and 67 swing in the corresponding horizontal planes, thereby moving wafers 5 mounted the wafer mounting arm 68 in a horizontal direction.

Two sets of the arm 67 and the wafer mounting arm 68 are disposed. The distance between the wafer mounting arms 68 is made equal to the pitch of the wafer supporting grooves 45 of the wafer holder 40 and the pitch of wafers 5 mounted in the wafer boat 75 contained in the reaction chamber 70. Accordingly, there is no need for changing the pitch of wafers 5 on the way of transfer between the wafer holder 40 and the reaction chamber 70. Thus, although the wafer-transfer vacuum robot 60 can transfer two wafers 5 at one time using the two wafer mounting arms 68, the structure of the wafer-transfer vacuum robot 60 can be simplified, and contamination of a vacuum atmosphere can be prevented. Further, since two wafers 5 can be transferred at one time, the wafer transferring efficiency increases.

The driving unit container 61 has a hermetically sealed structure. Since the driving unit is accommodated in this hermetically sealed container 61, the atmosphere within the wafer transfer chamber 50 can be maintained clean.

A projecting section 52 whose shape corresponds to that of the driving unit container 61 is projected from a bottom 56 of the wafer transfer chamber 50 so as to accommodate the driving unit container 61. In order to accommodate the driving unit container 61, only the projecting section 52 is projected from the wafer transfer chamber 50 without increasing the entire size of the wafer transfer chamber 50, therefore the volume of the wafer transfer chamber 50 can be reduced, thereby reducing time required for evacuating the wafer transfer chamber 50.

A through-hole 57 is formed in the bottom 56 of the wafer transfer chamber 50. A screw shaft 561 is vertically disposed outside and under the wafer transfer chamber 50. A motor 566 is disposed on the upper portion of the screw shaft 561 so as to rotate the screw shaft 561. A nut 565 is attached to the screw shaft 561, thereby forming a ball screw by the nut 565 and the screw shaft 561. A lifting base 564 is fixed to the nut 565. One end of a support bar 563 for supporting the wafer-transfer vacuum robot 60 is fixed onto the lifting base 564 such that the support bar 563 stands upright on the lifting base 564. Another end of the support bar 563 is fixed to the upper end portion of the driving unit container 61 of the wafer-transfer vacuum robot 60. The support bar 563 is made of stainless steel. Metal bellows 562 is disposed so as to cover the support bar 563 and such that one end of the bellows 562 is fixed in a hermetically sealed manner onto the bottom 56 so as to surround the through-hole 57 while the other end of the bellows 562 is fixed in a hermetically sealed manner onto the top surface of the lifting base 564.

As the screw shaft 561 is rotated by the motor 566, the nut 565 goes up and down, and the lifting base 564 fixed to the nut 565 goes up and down accordingly. As the lifting base 564 goes up and down, the support bar 563, which is fixed perpendicularly onto the lifting base 564, for supporting the wafer-transfer vacuum robot 60 goes up and down, and the wafer-transfer vacuum robot 60 attached to the support bar 563 goes up and down accordingly.

The present embodiment uses the ball screw 560 composed of screw shaft 561 and the nut 565, thereby reducing friction and increasing mechanical efficiency. Since the ball screw 560 is disposed outside the wafer transfer chamber 50, the interior of the wafer transfer chamber 50 can be prevented from being contaminated, thereby preventing wafers 5 from being contaminated. Further, since the ball screw 560 is located under the bottom 56 of the wafer transfer chamber 50, the interior of the wafer transfer chamber 50 can be prevented from being contaminated with particles generated from the bellows 562.

Since the wafer-transfer vacuum robot 60 is mechanically connected to the lifting base 564 via the rigid stainless-steel support bar 563 for supporting the wafer-transfer vacuum robot 60, the wafer-transfer vacuum robot 60 goes up and down reliably as the lifting base 564 goes up and down.

The support bar 563 for supporting the wafer-transfer vacuum robot 60 is covered with the bellows 562 such that one end of the bellows 562 is fixed in a hermetically sealed manner onto the bottom 56 of the wafer transfer chamber 50 so as to surround the through-hole 57 while the other end of the bellows 562 is fixed in a hermetically sealed manner onto the top surface of the lifting base 564. The bellows 562, therefore, maintains reliably the wafer transfer chamber 50 in a hermetically sealed state, thereby allowing the wafer transfer chamber 50 to be evacuated. Also, since the movement of the support bar 563 for supporting the wafer-transfer vacuum robot 60 is isolated from the maintenance of hermetic seal, the support bar 563 moves smoothly and reliably.

Further, since an end of the support bar 563 for supporting the wafer-transfer vacuum robot 60 is fixed onto the upper end portion of the driving unit container 61 of the wafer-transfer vacuum robot 60, the height of the wafer transfer chamber 50 can be reduced, and accordingly the height of the entire semiconductor wafer processing apparatus 1 can be reduced.

The entire semiconductor wafer processing apparatus 1 is accommodated in a housing 900. A filter (not shown) and a fan (not shown) are disposed on the ceiling of the housing 900 corresponding to the front section 100 so as to produce a downflow into the housing 900. Cassette shelves 11 for mounting the cassettes 10 thereon are disposed within and attached to the housing 900. The cassette shelves 11 are disposed substantially opposite to the wafer transfer chamber 50 with respect to the intermediate wafer holding chamber 30. Three cassette shelves 11 are arranged in each of horizontal planes located at two different positions in the vertical direction. That is, a first set of three cassette shelves 11 are arranged at the same height, and a second set of three cassette shelves 11 are disposed above the first set of cassette shelves 11. As a result of providing the cassette shelves 11 within the housing 900, the surfaces of wafers 5 carried in the cassette 10 can be maintained clean. Also, since a plurality of cassettes 11 are provided, cassettes 11 can be arranged for each of a plurality of kinds of processing. Moreover, it is possible to dispose a cassette which holds wafers for monitoring and a cassette which holds dummy wafers.

A cassette IN/OUT opening 13 is provided at the lower portion of the front panel 901 of the housing 900. A cassette stage 12 is disposed within the housing 900 at the substantially same height as that of the cassette IN/OUT opening 13. The cassette 10 carried into the housing 900 through the cassette IN/OUT opening 13 is temporarily held on the cassette stage 12, and also the cassette 10 which contains the processed wafers 5 is temporarily held on the cassette stage 12 before it is delivered out from the housing 900.

The cassette stage 12 is located under the cassette shelves 11 so as to prevent the wafers 5 contained in the cassette 10 placed on the cassette shelf 11 from being affected by particles which enter the housing 900 from outside through the cassette IN/OUT opening 13 when the cassette 10 enters/leaves the housing 900.

Between the intermediate wafer holding chamber 30 and the cassette shelves 11 is disposed the cassette transfer and wafer transfer device 20 which can load the cassette 10 onto and unload from the cassette shelf 11 and which can transfer wafers 5 between the cassette 10 and the intermediate wafer holding chamber 30. The cassette transfer and wafer transfer device 20 has a ball screw composed of a screw shaft 29 and a nut (not shown). As the screw shaft 29 rotates, the cassette transfer and wafer transfer device 20 goes up and down accordingly. Since the cassette transfer and wafer transfer device 20 is provided within the housing 900, the surfaces of wafers 5 being transferred thereby can be maintained clean.

Figure 7:
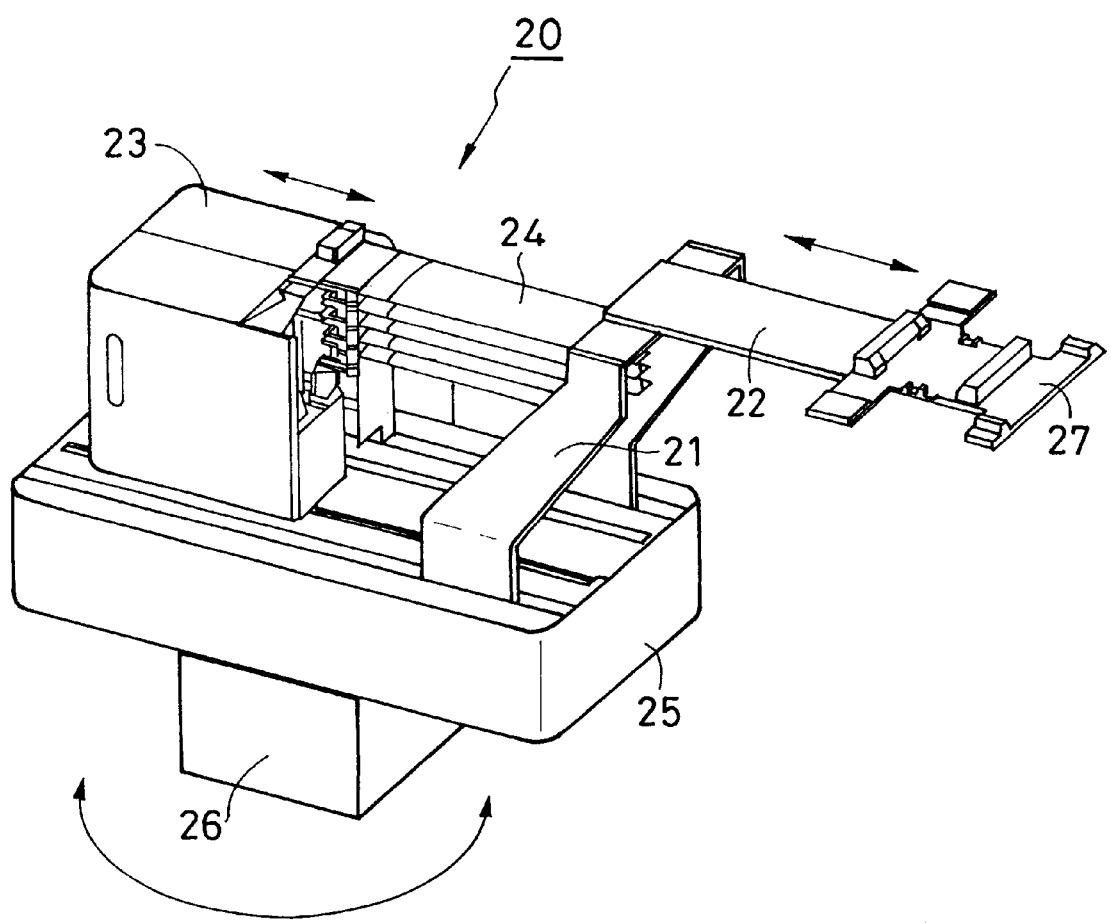
FIG. 7 is a schematic perspective view for explaining a cassette transfer and wafer transfer device for use in the first through seventh embodiments of the present invention.

FIG. 7 is a schematic perspective view for explaining the cassette transfer and wafer transfer device 20.

A cassette transfer device 21 and a wafer transfer device 23 are disposed on bases 25 and 26 and can independently perform parallel displacement in the direction of a corresponding arrow. The cassette transfer device 21 has a cassette transfer arm 22 and transfers the cassette 10 which is mounted on a cassette holder 27 attached to an end of the cassette transfer arm 22. The wafer transfer device 23 has a plurality of tweezers 24, each carrying wafers 5 by mounting wafers 5 thereon.

Figure 8A:
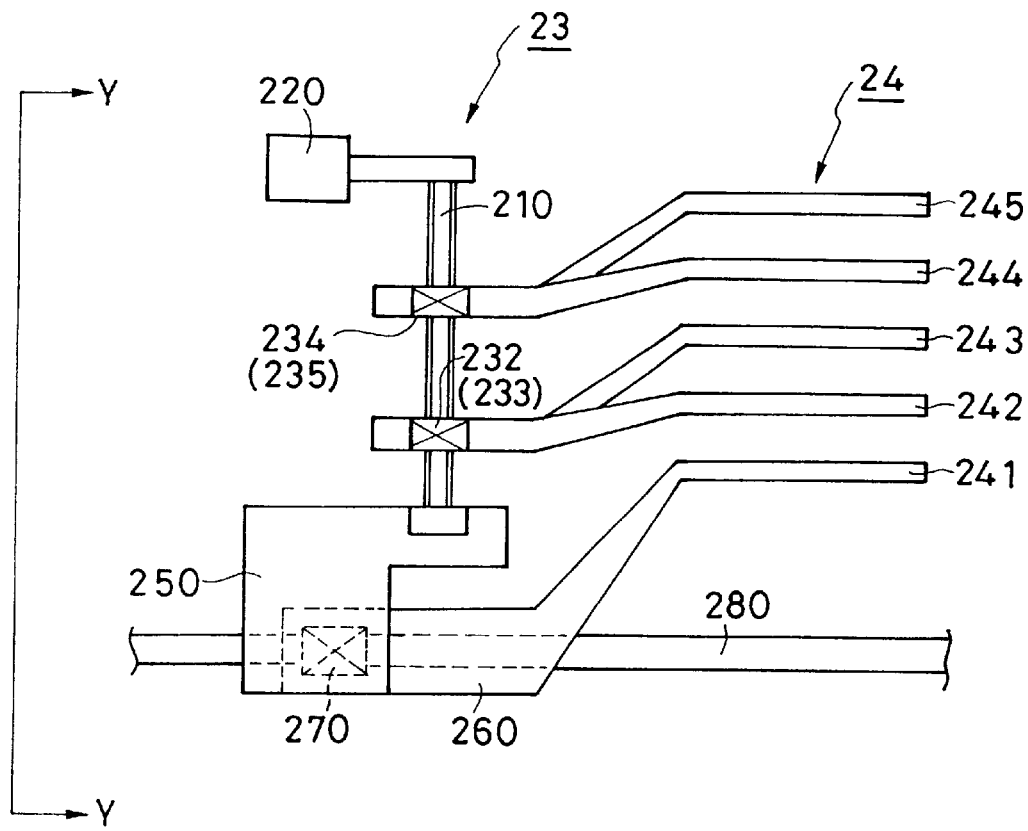
FIG. 8A is a side view for explaining a pitch changing mechanism of the cassette transfer and wafer transfer device for use in the first through seventh embodiments of the present invention.
Figure 8B:
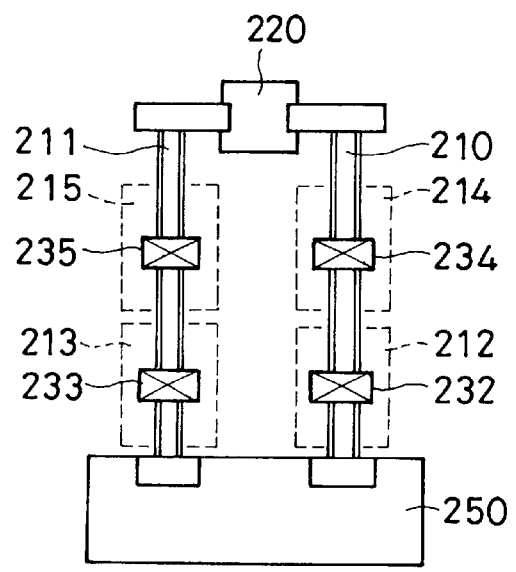
FIG. 8B is a rear view taken along the line Y—Y in FIG. 8A.

FIG. 8A is a side view for explaining the pitch changing mechanism of the cassette transfer and wafer transfer device, and FIG. 8B is a rear view taken along the line Y—Y in FIG. 8A.

In the present embodiment, the wafer transfer device 23 has five tweezers 241–245. The tweezer 241 is integral with a block 260. Nuts 232, 233, 234, and 235 are fixed to the tweezers 242, 243, 244 and 245, respectively. The nuts 232 and 234 are in screw-engagement with a screw shaft 210, thereby forming ball screws, respectively. The nuts 233 and 235 are in screw-engagement with a screw shaft 211, thereby forming ball screws, respectively. The upper ends of the screw shafts 210 and 211 are connected to a motor 220 via an unillustrated gear mechanism. The lower ends of the screw shafts 210 and 211 are rotatably supported by the block 250. Between the block 250 and the block 260 is disposed a nut 270, which is in screw-engagement with a screw shaft 280. The nut 270 and the screw shaft 280 constitute a ball screw. When the screw shaft 280 is rotated, the nut 27 moves in a horizontal direction accordingly so as to move the tweezers 241–245 rightward and leftward in FIG. 8A.

A thread of a certain pitch is formed in an area 212 of the screw shaft 210 in which the nut 232 is engaged with the screw shaft 210, while a thread having a pitch double the pitch in the area 212 is formed in an area 213 of the screw shaft 211 in which the nut 233 is engaged with the screw shaft 211. A thread having a pitch three times the pitch in the area 212 is formed in an area 214 of the screw shaft 210 in which the nut 234 is engaged with the screw shaft 210, while a thread having a pitch four times the pitch in the area 212 is formed in an area 215 of the screw shaft 211 in which the nut 235 is engaged with the screw shaft 211. No relative movement in the vertical direction occurs between the blocks 250 and 260. When the screw shafts 210 and 211 are rotated by the motor 220, the nut 232 is raised by a predetermined distance relative to the blocks 250 and 260, which are stationary. Further, the nut 233 is raised over a distance double the distance over which the nut 232 is raised, the nut 234 is raised over a distance three times the distance over which the nut 232 is raised, and the nut 235 is raised over a distance four times the distance over which the nut 232 is raised. As a result, the tweezer 241 is not raised, the tweezer 242 is raised over a predetermined distance, the tweezer 243 is raised over a distance double the raised distance of the tweezer 242, the tweezer 244 is raised over a distance three times the raised distance of the tweezer 242, and the tweezer 245 is raised over a distance four times the raised distance of the tweezer 242. As a result, the pitch of the tweezers 241–245 can be changed uniformly.

FIG. 9 is a schematic cross-sectional view for explaining the operation of transferring wafers 5 in the semiconductor processing apparatus 1 according to the first embodiment. The operation for transferring and processing wafers 5 will be described with reference to FIGS. 3–9.

The cassette 10 which has been carried into the housing 900 of the semiconductor wafer processing device 1 through the cassette IN/OUT opening 13 is first placed on the cassette stage 12. Then, the cassette 10 is transferred onto the cassette holder 27 attached to the end of the cassette transfer arm 22 of the cassette transfer and wafer transfer device 20. The cassette transfer and wafer transfer device 20 carries the cassette 10 to the upper portion of the housing 900 and then transfers it onto the cassette shelf 11. Next, the cassette transfer device 21 moves leftward, and the wafer transfer device 23 then moves rightward so that the wafers 5 in the cassette 10 are mounted onto the tweezers 24. At this time, the pitch of the tweezers 24 is set to be equal to the pitch of the grooves of the cassette 10.

Subsequently, the wafer transfer device 23 is retracted and rotated by 180 degrees. Next, the pitch of the tweezers 24 is changed such that the pitch of the tweezers 24 becomes equal to the pitch of the wafer supporting grooves 45 of the wafer holder 40. Subsequently, the tweezers 24 are moved leftward so as to load wafers 5 into wafer holder 40 within the intermediate wafer holding chamber 30. In the present embodiment, five wafers 5 are transferred at once from the cassettes 10 to the wafer holder, 40 by the cassette transfer and wafer transfer device 20. When the wafers 5 are transferred into the intermediate wafer holding chamber 30 by the cassette transfer and wafer transfer device 20, the gate valve 92 is closed, while the front door valve 91 is opened.

After the wafer holder 40 in the intermediate wafer holding chamber 30 is loaded with the wafers 5, the front door valve 91 is closed, and the intermediate wafer holding chamber 30 is evacuated.

After the evacuation, the gate valve 92 is opened. The wafer transfer chamber 50 has been evacuated in advance.

Subsequently, the wafers 5 are held by the wafer mounting arms 68 of the wafer-transfer vacuum robot 60 in the evacuated wafer transfer chamber 50, and are transferred from the wafer holder 40 within the intermediate wafer holding chamber 30 to the wafer boat 75 within the reaction chamber 70. At this time, the gate value 93 is open, and the reaction chamber 70 has already been evacuated. Since the pitch of the wafer supporting grooves 45 of the wafer holder 40 is equal to the pitch of the wafers 5 loaded on the wafer boat 75, the pitch of the wafer mounting arms 68 of the wafer-transfer vacuum robot 60 is not changed and is maintained constant. In the present embodiment, two wafers are transferred at a time from the wafer holder 40 to the wafer boat 75 by the wafer-transfer vacuum robot 60.

After the transfer operation, the gate valve 93 is closed, and a predetermined atmosphere is created in the reaction chamber 70. Subsequently, the two wafers 5 loaded onto the wafer boat 75 in the reaction chamber 70 are simultaneously subjected to a predetermined processing such as film forming processing.

Upon completion of the predetermined processing, the reaction chamber 70 is evacuated, and the gate valve 93 is opened. The wafers 5 are transferred to the wafer holder 40 within the evacuated intermediate wafer holding chamber 30 by the wafer-transfer vacuum robot 60. At this time, the pitch of the wafer carrying arms 68 of the wafer-transfer vacuum robot 60 is not changed and is maintained constant. Two wafers are transferred at a time.

Subsequently, the gate valve 92 is closed, and atmospheric pressure is created in the intermediate wafer holding chamber 30 using nitride or the like, and the wafers 5 are cooled until the temperature of each wafer reaches a predetermined temperature.

Subsequently, the front door valve 91 is opened, and the wafers 5 are transferred into the cassette 10 by the wafer transfer device 23 of the cassette transfer and wafer transfer device 20. At this time, the pitch of the tweezers 24 is changed from a pitch corresponding to the pitch of the wafer supporting grooves 45 of the wafer holder 40 to a pitch corresponding to the pitch of the grooves of the cassette 10.

When a predetermined number of wafers 5 are transferred into the cassette 10, the cassette 10 is transferred to the cassette stage 12 by the cassette transfer device 21. The cassette 10 is then taken out through the cassette IN/OUT opening 13.

As described above, since two wafers are simultaneously treated in the reaction chamber 70, wafers can be processed with an improved efficiency. Since the pitch of the wafer supporting grooves 45 of the wafer holder 40 is equal to the pitch of wafers held on the wafer boat 75, it is not necessary to change the pitch of wafer mounting arms 68 of the wafer-transfer vacuum robot 60. Therefore, the structure of the wafer-transfer vacuum robot 60 can be simplified and the vacuum created in the wafer transfer chamber 50 is prevented from being contaminated. Since two wafers 5 can be transferred at a time, the efficiency of wafer transfer can be increased.

Although the pitch of wafers 5 is changed by the cassette transfer and wafer transfer device 20, the cassette transfer and wafer transfer device 20 is used under the atmospheric pressure. Therefore, even when the pitch of wafers 5 is changed, the cassette transfer and wafer transfer device 20 can have a simpler structure and can be manufactured at lower cost compared to the case in which the pitch of wafers 5 is changed in a vacuum. In addition, the generation of particles can be suppressed.

As described above, the pitch of wafers 5 is changed under the atmospheric pressure and is fixed under the reduced pressure, and a plurality of wafers 5 are transferred at a time. Therefore, the manufacturing cost of the transfer apparatus can be decreased, and the size of the transfer apparatus is prevented from increasing. In addition, the generation of particles is suppressed, so that wafers 5 can be transferred in a clean environment. Moreover, simultaneous transfer of a plurality of wafers 5 improves the throughput, and the capability of changing the pitch of wafers 5 makes it possible to change the pitch of wafers 5 so as to guarantee that wafer processing is performed highly accurately in the reaction chamber 70.

In the present embodiment, the walls 53 and 54 of the wafer transfer chamber 50 are opposed to each other so as to arrange on a substantially straight line the reaction chamber 70, the wafer transfer chamber 50, and the intermediate wafer holding chamber 30, and the wafer transfer chamber 50 has a rectangular shape as viewed from above. As the wafer transfer chamber 50 has a rectangular shape, the size of the wafer transfer chamber 50 can be reduced, and the area occupied by the wafer transfer chamber 50 can be reduced accordingly. Thus, the semiconductor wafer processing apparatus 1 occupies less area within a clean room. By adopting the rectangular shape, the cost of manufacture of the wafer transfer chamber 50 is reduced, and a required maintenance space is also reduced. Further, the distance over which a connection is made between the wafer transfer chamber 50 and another wafer transfer chamber or the like can be reduced. This allows the wafers 5 to be readily transferred between the wafer transfer chamber 50 and another wafer transfer chamber or the like without providing a wafer transfer device at a connecting section therebetween; thus the semiconductor wafer processing apparatus 1 can accordingly be made simpler in structure and manufactured at lower cost. A plurality of semiconductor wafer processing units, each having the structure such that the reaction chamber 70, the wafer transfer chamber 50, and the intermediate wafer holding chamber 30 are arranged on a substantially straight line, can be readily arranged in parallel so that they occupy less area.

Second Embodiment

Figure 10:
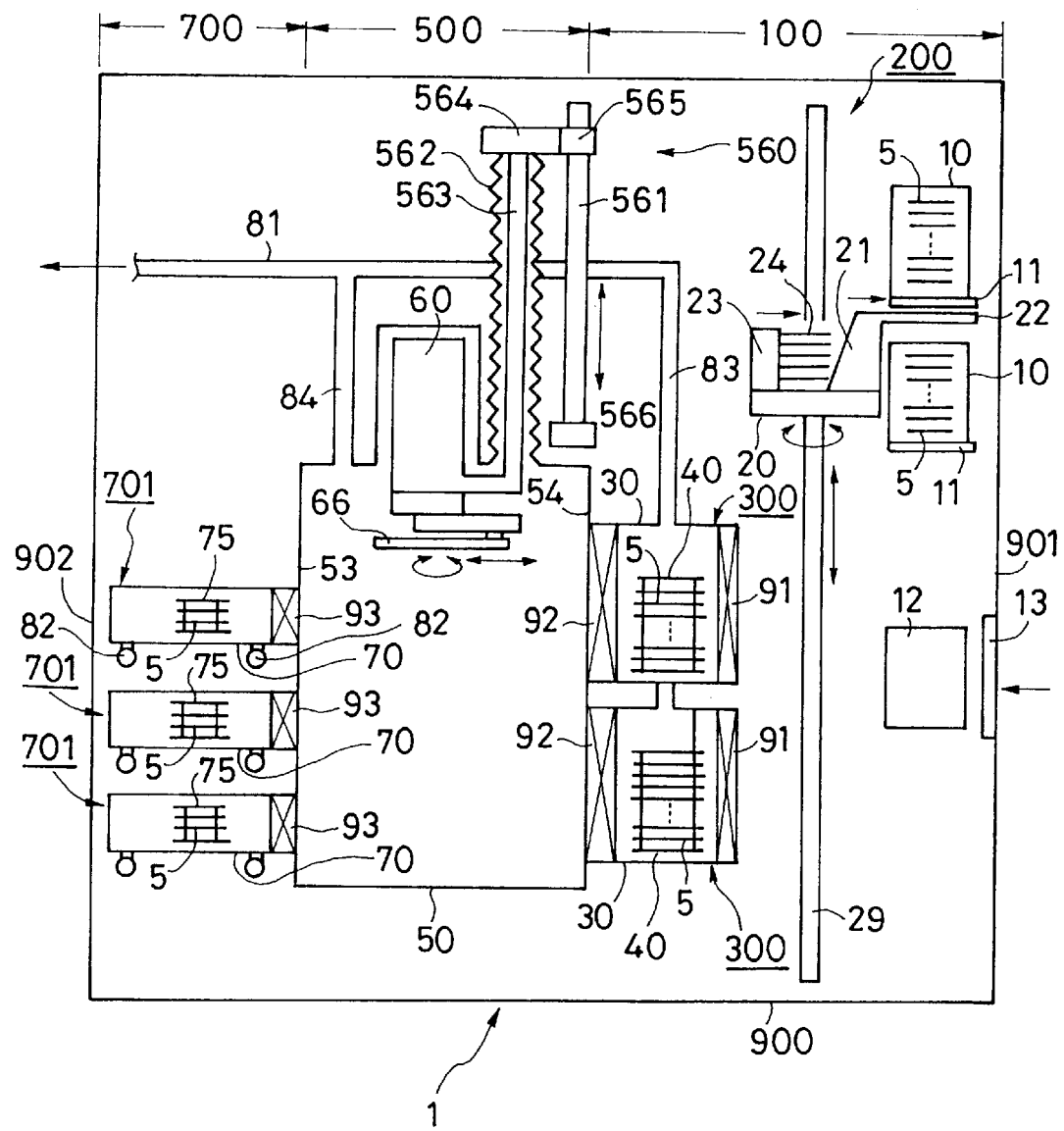
FIG. 10 is a cross-sectional view for explaining a semiconductor wafer processing apparatus according to a second embodiment of the present invention.

FIG. 10 is a cross-sectional view for explaining a semiconductor wafer processing apparatus according to a second embodiment of the present invention. The semiconductor wafer processing apparatus 1 of the present embodiment is the same as that of the first embodiment except that: the reactions chambers 70, the wafer transfer chamber 50, and the intermediate wafer holding chambers 30 are located at the lower portion of the housing 900; and the wafer-transfer vacuum robot 60, and the screw shaft 561 and the like for lifting/lowering the wafer-transfer vacuum robot 60 are located at the upper portion of the housing 900.

Third Embodiment

Figure 11:
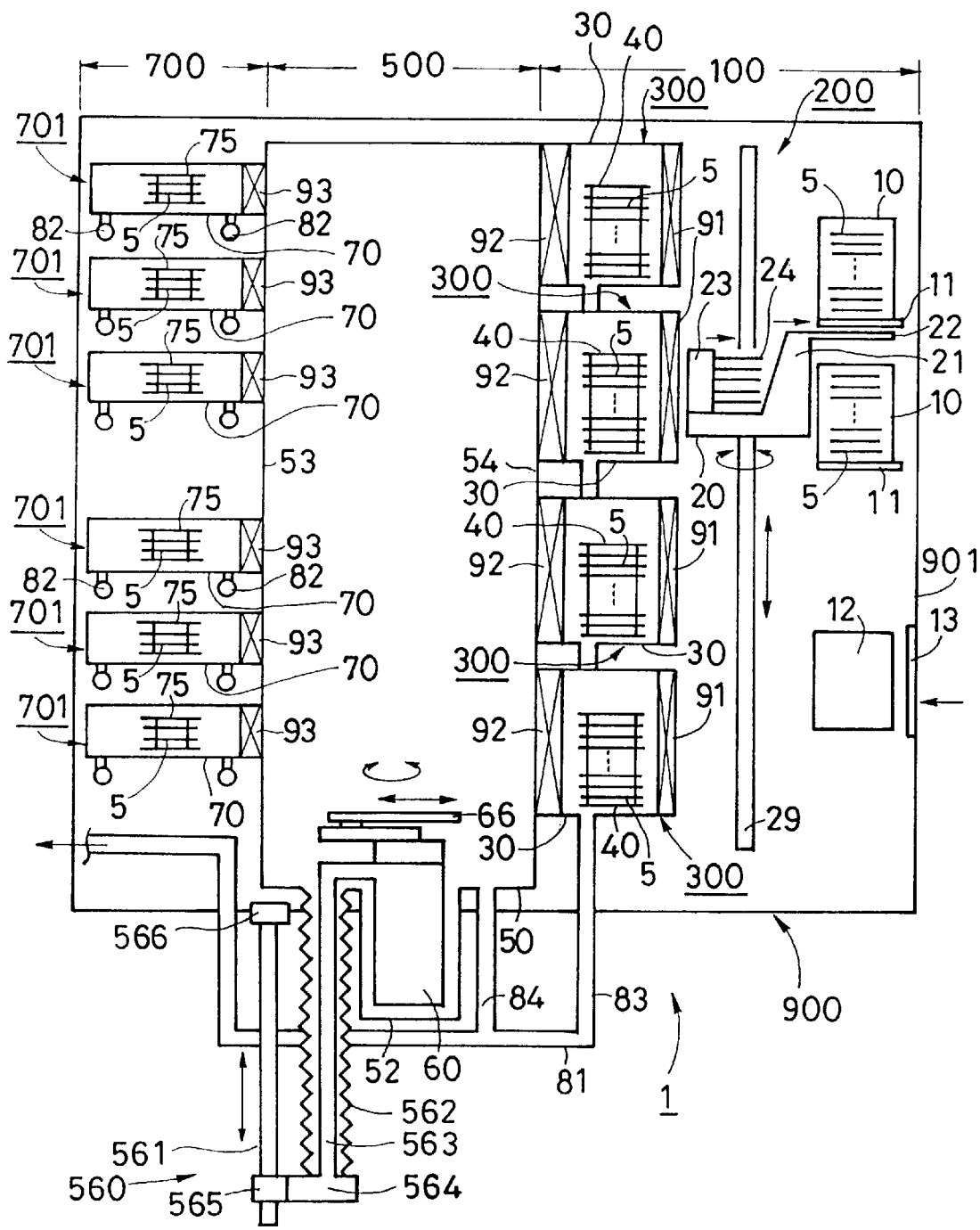
FIG. 11 is a cross-sectional view for explaining a semiconductor wafer processing apparatus according to a third embodiment of the present invention.

FIG. 11 is a cross-sectional view for explaining a semiconductor wafer processing apparatus according to a third embodiment of the present invention.

According to the present embodiment, six reaction chambers 70 are arranged in the vertical direction on the wall 53 of the wafer transfer chamber 50, and four intermediate wafer holding chambers 30 are arranged in the vertical direction on the wall 54 of the wafer transfer chamber 50. Because of an increase in the number of the reaction chambers 70 as well as the intermediate wafer holding chambers 30, the height of the wafer chamber 50 is increased accordingly. In order to accommodate this many reaction chambers 70 and intermediate wafer holding chambers 30 within the housing 900, the projecting section 52 of the wafer transfer chamber 50, the screw shaft 561, the bellows 562, and the support bar 563 for supporting the wafer-transfer vacuum robot 60 are partially projected from the housing 900. Since these projecting portions can be projected downward from the floor of a clean room, the height of the wafer transfer chamber 50 can be increased, thereby allowing more reaction chambers 70 as well as more intermediate wafer holding chambers 30 to be arranged in the vertical direction. Thus, more wafers 5 can be processed within less area.

Fourth Embodiment

Figure 12:
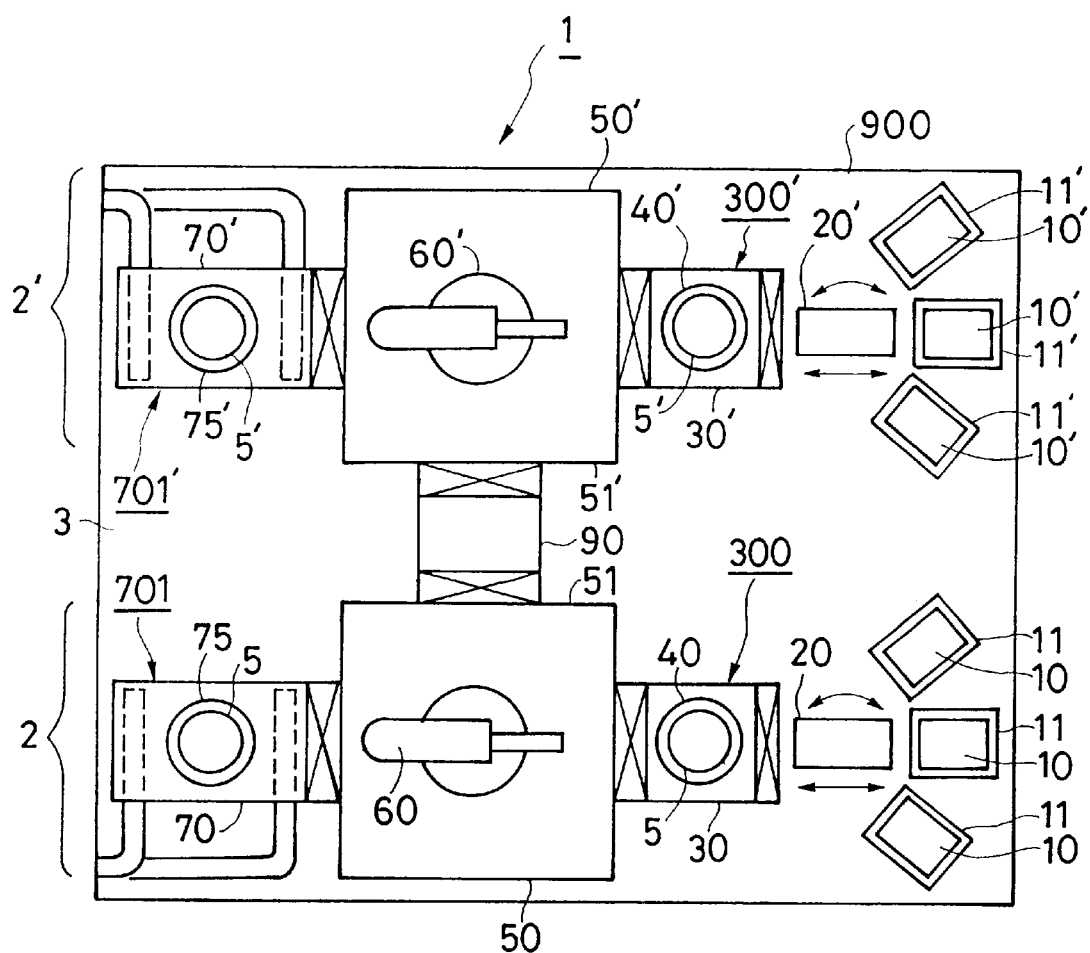
FIG. 12 is a plan view for explaining a semiconductor wafer processing apparatus according to a fourth embodiment of the present invention.

FIG. 12 is a plan view for explaining a semiconductor wafer processing apparatus according to a fourth embodiment of the present invention.

In the present embodiment, semiconductor wafer processing units 2 and 2' are disposed in parallel, the unit 2 (2') having the structure such that the reaction chamber 70 (70'), the wafer transfer chamber 50 (50'), the intermediate wafer holding chamber 30 (30'), the cassette transfer and wafer transfer device 20 (20'), and the cassette shelf 10 (10') are arranged on a substantially straight line. The semiconductor wafer processing units 2 and 2' each having such a structure can be readily disposed in parallel, thereby reducing the area occupied by the entire apparatus composed of the units 2 and 2'.

The wafer transfer chamber 50 (50') has a rectangular shape as viewed from above. Accordingly, the distance over which a connection is made between the wafer transfer chamber 50 and the wafer transfer chamber 50' can be reduced. This allows a wafer to be readily transferred between the wafer transfer chamber 50 and the wafer transfer chamber 50' without providing a wafer transfer device in an intermediate wafer transfer chamber 90, which serves as a connecting section between the chambers 50 and 50'. Thus, the semiconductor wafer processing apparatus 1 can accordingly be made simpler in structure and manufactured at lower cost. The intermediate wafer holding chamber 90 can also be used as a cooling chamber for cooling a wafer or as a preheating chamber for preheating a wafer.

A space located between the reaction chamber 70 and the reaction chamber 70' is large enough for use as a common maintenance space 3 for the semiconductor wafer processing units 2 and 2'.

Fifth Embodiment

Figure 13:
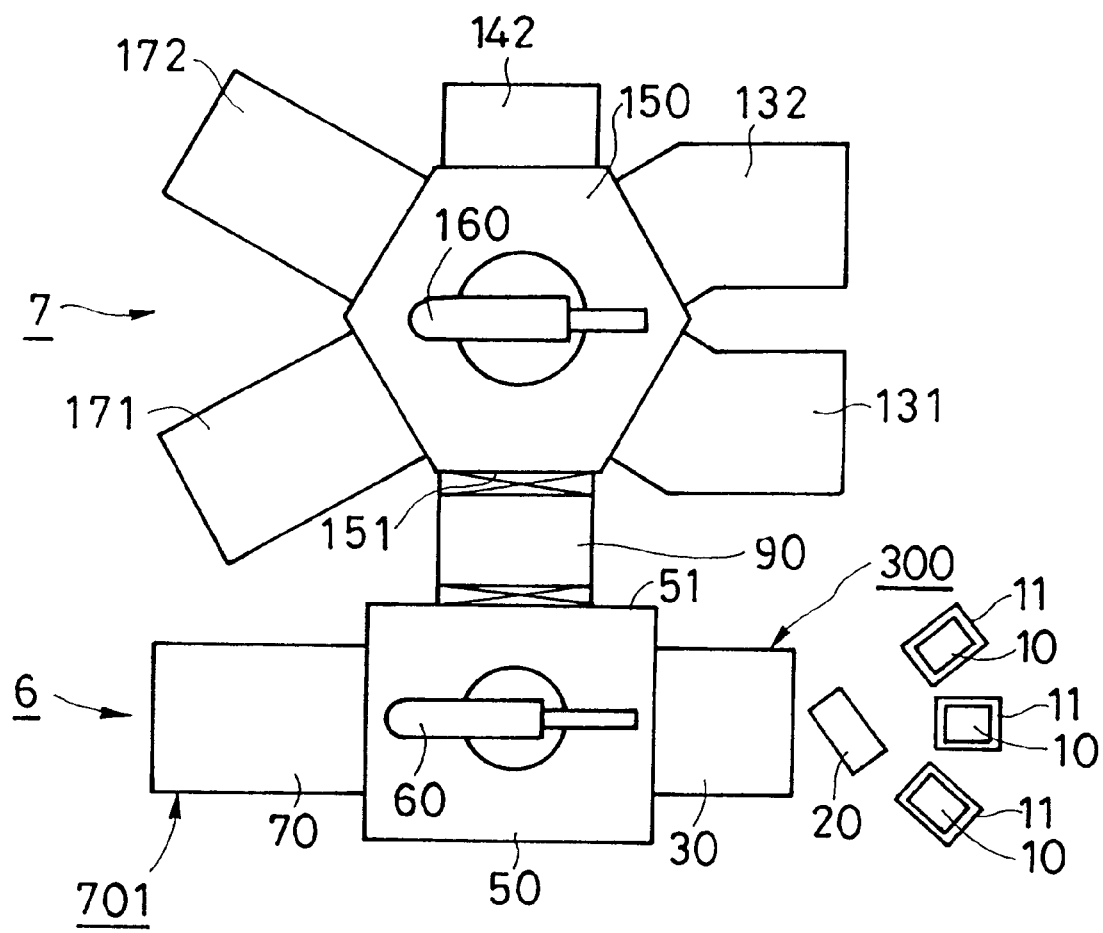
FIG. 13 is a plan view for explaining a semiconductor wafer processing apparatus according to a fifth embodiment of the present invention.

FIG. 13 is a plan view for explaining a semiconductor wafer processing apparatus according to a fifth embodiment of the present invention.

In the present embodiment, a semiconductor wafer processing unit 6 according to the present invention, which has the structure such that the reaction chamber 70, the wafer transfer chamber 50, the intermediate wafer holding chamber 30, the cassette transfer and wafer transfer device 20, and the cassette shelf 10 are arranged on a substantially straight line, is connected to a semiconductor wafer processing unit 7, which includes a wafer transfer chamber 150 which is hexagon-shaped as viewed from above and on side walls of which cassette chambers 131 and 132, reaction chambers 171 and 172, and a wafer cooling chamber 142 are provided.

Since the wafer transfer chamber 50 is rectangle-shaped, it can be readily connected via the wall 51 thereof to a semiconductor wafer processing unit having a different shape.

Also, in the present embodiment, the distance over which a connection is made between the wafer transfer chamber 50 and the wafer transfer chamber 150 can be reduced. This allows a wafer to be readily transferred between the wafer transfer chamber 50 and the wafer transfer chamber 150 without providing a wafer transfer device in an intermediate wafer transfer chamber 90, which serves as a connecting section between the chambers 50 and 150. Thus, the semiconductor wafer processing apparatus as a whole can accordingly be made simpler in structure and manufactured at lower cost. The intermediate wafer transfer chamber 90 can also be used as a cooling chamber for cooling a wafer or as a preheating chamber for preheating a wafer.

Sixth Embodiment

Figure 14:
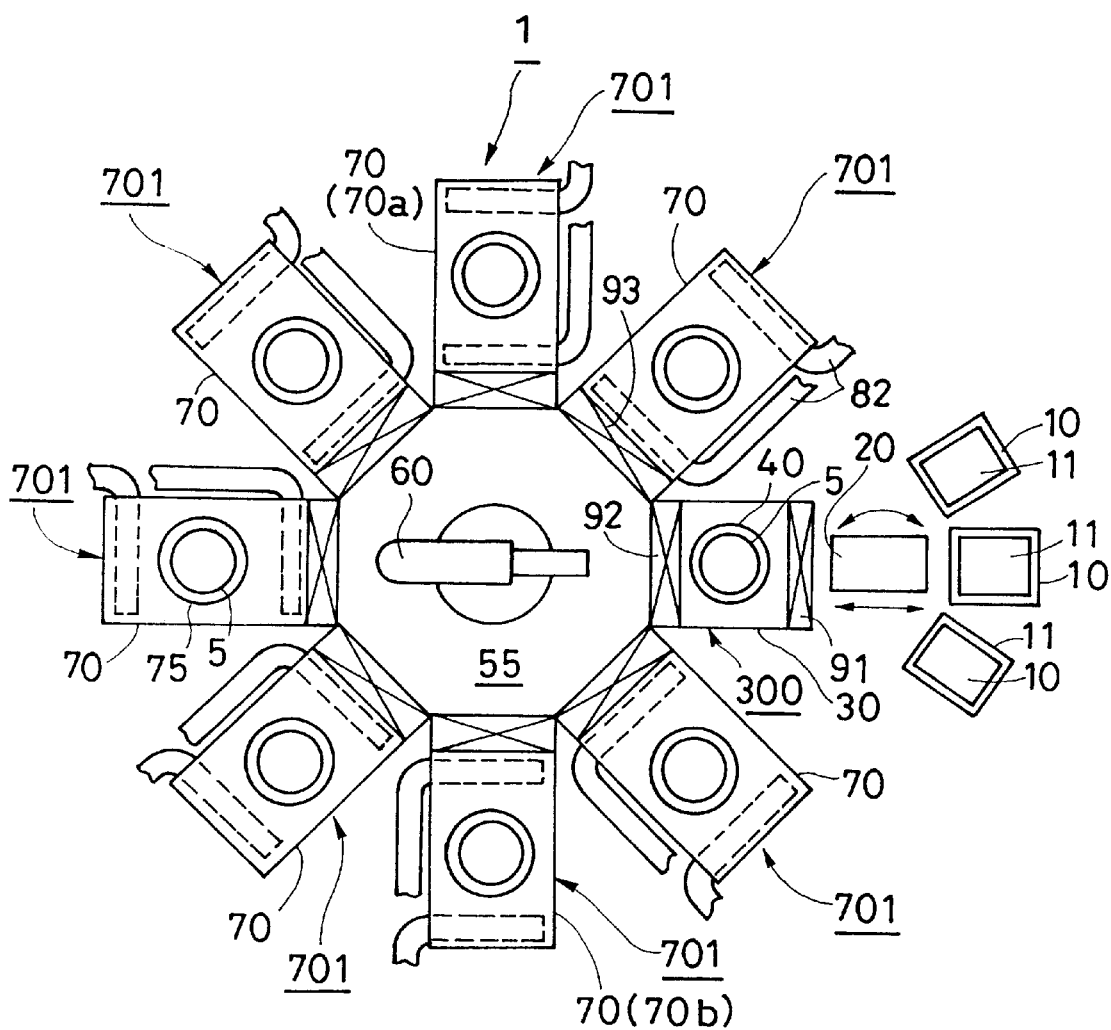
FIG. 14 is a plan view for explaining a semiconductor wafer processing apparatus according to a sixth embodiment of the present invention.

FIG. 14 is a plan view for explaining a semiconductor wafer processing apparatus according to a sixth embodiment of the present invention.

In the present embodiment, a wafer transfer chamber 55 is octagon-shaped as viewed from above, and the reaction chambers 70 are provided in layers on each of the seven side walls of the wafer transfer chamber 55.

Seventh Embodiment

Figure 15:
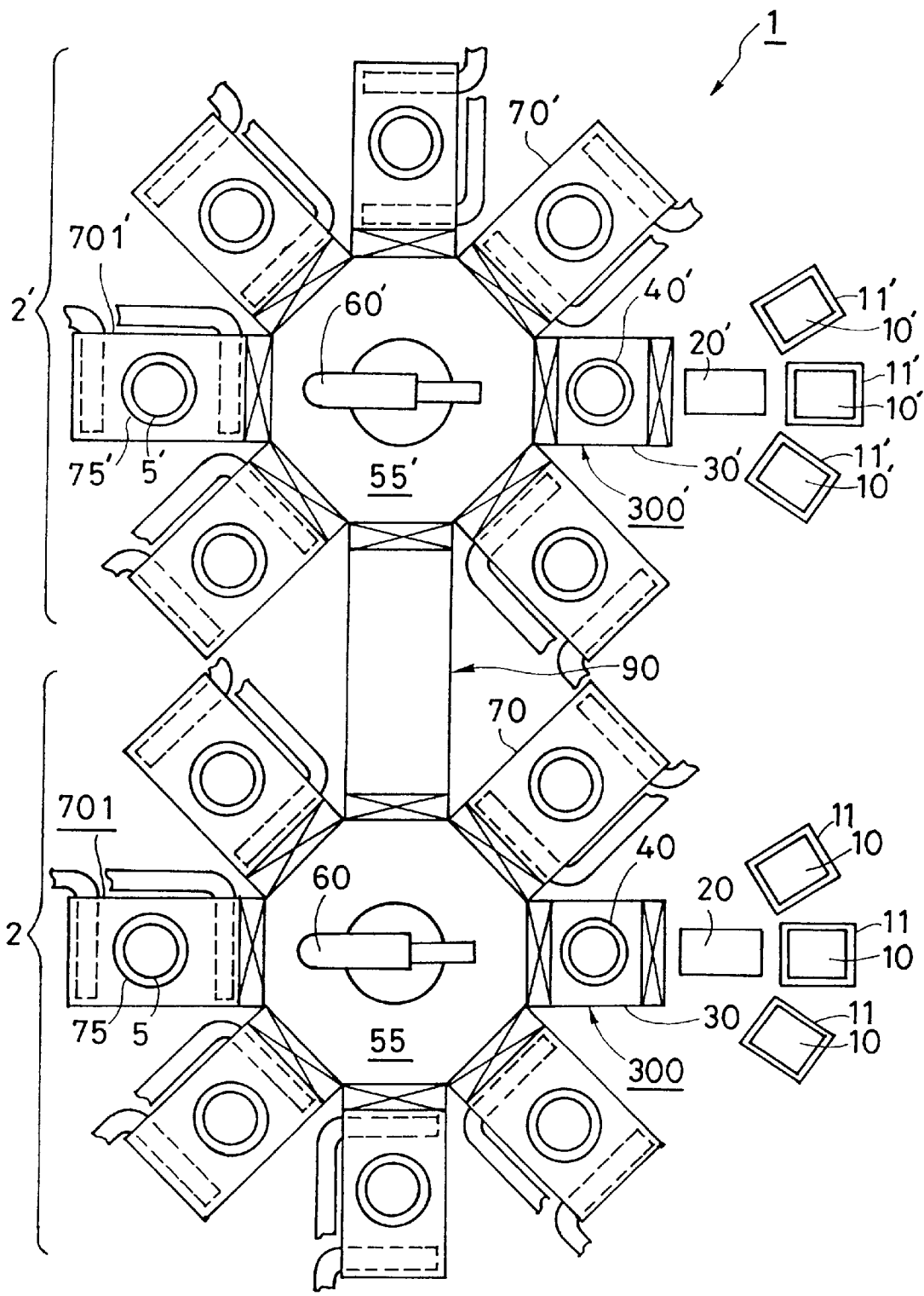
FIG. 15 is a plan view for explaining a semiconductor wafer processing apparatus according to a seventh embodiment of the present invention.

FIG. 15 is a plan view for explaining a semiconductor wafer processing apparatus according to a seventh embodiment of the present invention.

In the present embodiment, the wafer transfer chamber 55 of FIG. 14 from which reaction chambers 70a are removed is connected via an intermediate wafer transfer chamber 90 to the wafer transfer chamber 55 of FIG. 14 from which reaction chambers 70b are removed. The intermediate wafer transfer chamber 90 can also be used as a cooling chamber for cooling a wafer or as a preheating chamber for preheating a wafer.

What is claimed is:

1. A substrate transferring mechanism, comprising:
   a cassette holding device for holding a cassette in which substrates are to be stacked;
   a substrate holding device for holding said substrate or said substrates;
   a substrate transfer device for transferring said substrate from said cassette held by said cassette holding device to said substrate holding device and/or transferring said substrate from said substrate holding device to said cassette held by said cassette holding device;
   a cassette transferring device for transferring the cassette to and from said cassette holding device;
   wherein said substrate transfer device and said cassette transfer device are mounted on a single elevator.

2. The substrate transferring mechanism according to claim 1 further comprising:
   a substrate processing device for processing at least one of said substrates.

3. A substrate processing apparatus, comprising:
   a cassette holding device for holding a cassette in which substrates are to be stacked;
   a substrate holding device for holding said substrate or said substrates;
   a substrate transfer device for transferring said substrate from said cassette held by said cassette holding device to said substrate holding device and/or transferring said substrate from said substrate holding device to said cassette held by said cassette holding device;
   a cassette transferring device for transferring the cassette to and from said cassette holding device; and
   a substrate processing device for processing at least one of said substrates;
   wherein said substrate transfer device and said cassette transfer device are mounted on a single elevator.

* * * * *